(12) United States Patent
Aramaki et al.

(10) Patent No.: US 9,437,521 B2
(45) Date of Patent: Sep. 6, 2016

(54) THERMALLY CONDUCTIVE SHEET

(71) Applicant: DEXERIALS CORPORATION, Tokyo (JP)

(72) Inventors: Keisuke Aramaki, Tokyo (JP); Takuhiro Ishii, Tokyo (JP); Masahiko Ito, Tokyo (JP); Shinichi Uchida, Tokyo (JP); Atsuya Yoshinari, Tokyo (JP); Syunsuke Uchida, Tokyo (JP)

(73) Assignee: DEXERIALS CORPORATION, Tokyo (JP)

( * ) Notice: Subject to any disclaimer, the term of this patent is extended or adjusted under 35 U.S.C. 154(b) by 0 days.

(21) Appl. No.: 14/989,686

(22) Filed: Jan. 6, 2016

(65) Prior Publication Data

US 2016/0118316 A1    Apr. 28, 2016

Related U.S. Application Data

(63) Continuation of application No. PCT/JP2014/068258, filed on Jul. 9, 2014.

(30) Foreign Application Priority Data

Jul. 10, 2013  (JP) ................................. 2013-145035
Apr. 18, 2014  (JP) ................................. 2014-086432

(51) Int. Cl.
*H01L 23/48*    (2006.01)
*H01L 23/373*   (2006.01)
*H01L 23/367*   (2006.01)
*B29C 47/00*    (2006.01)
*B29L 31/18*    (2006.01)

(52) U.S. Cl.
CPC ....... *H01L 23/3737* (2013.01); *B29C 47/0066* (2013.01); *H01L 23/3675* (2013.01); *H01L 23/3733* (2013.01); *B29L 2031/18* (2013.01)

(58) Field of Classification Search
CPC .......... H01L 23/3675; H01L 23/3737; H01L 23/3733
See application file for complete search history.

(56) References Cited

U.S. PATENT DOCUMENTS

2007/0231552 A1 * 10/2007  Yoda ........................ B32B 7/02
                                                       428/209

FOREIGN PATENT DOCUMENTS

| JP | 2004-363272 A | 12/2004 |
|----|---------------|---------|
| JP | 2002-046137 A | 2/2007  |
| JP | 2007-277405 A | 10/2007 |
| JP | 2007-277406 A | 10/2007 |
| JP | 2009-055021 A | 3/2009  |
| JP | 2010-050240 A | 3/2010  |

(Continued)

OTHER PUBLICATIONS

Notice of Reasons for Rejection, drafted on Mar. 12, 2015, for the corresponding Japanese Patent Application No. JP 2014-086432. (With English Translation).
International Search Report dated, Sep. 30, 2014, for corresponding International Patent Application No. PCT/JP2014/068258.
International Preliminary Report on Patentability issued Oct. 10, 2015, for corresponding International Patent Application No. PCT/JP2014/068258.

(Continued)

*Primary Examiner* — Nicholas Tobergte
(74) *Attorney, Agent, or Firm* — Pergament & Cepeda LLP; Milagros A. Cepeda; Edward D. Pergament

(57) ABSTRACT

A thermally conductive sheet, comprising a curable resin composition, thermally conductive fibers, and thermally conductive particles, wherein the thermally conductive sheet has a compressibility of 40% or more.

19 Claims, 17 Drawing Sheets

(56) References Cited

FOREIGN PATENT DOCUMENTS

| JP | 2010-056299 A | 3/2010 |
|---|---|---|
| JP | 2013-131562 A | 7/2013 |
| JP | 2013-131564 A | 7/2013 |

OTHER PUBLICATIONS

Written Opinion dated, Sep. 30, 2014, for corresponding International Patent Application No. PCT/JP2014/068258.

* cited by examiner

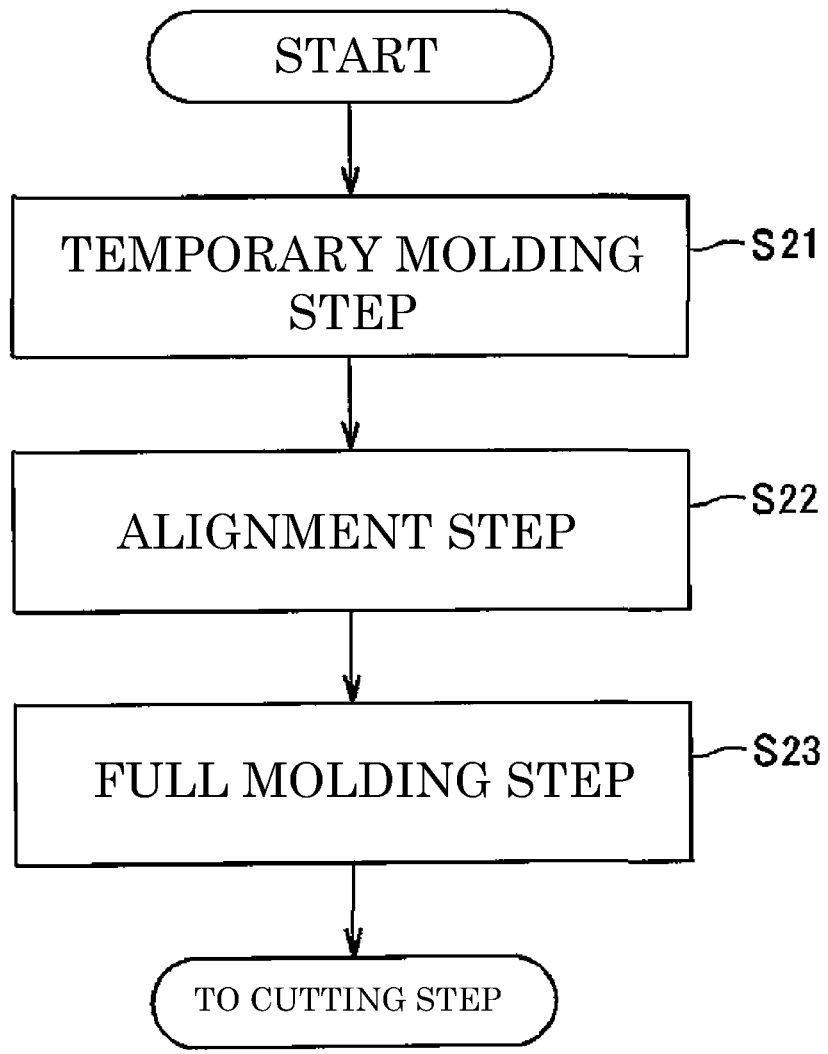

THERMALLY CONDUCTIVE SHEET

CROSS-REFERENCE TO RELATED APPLICATION

This application is a continuation application of International Application PCT/JP2014/068258 filed on Jul. 9, 2014 which designated the U.S., and claims priorities to Japanese Patent Application No. 2013-145035 filed on Jul. 10, 2013 and Japanese Patent Application No. 2014-086432 filed on Apr. 18, 2014, all of which are incorporated herein in their entirety by reference.

BACKGROUND OF THE INVENTION

1. Field of the Invention

The present invention relates to a thermally conductive sheet which promotes the heat dissipation of heat-generating electronic parts and the like.

2. Description of the Related Art

Along with higher performance of electronic devices, the density enhancement and packaging enhancement of semiconductor devices have proceeded. Along therewith, it becomes important to more efficiently dissipate heat generated from electronic parts constituting electronic devices. Semiconductors are attached to heat sinks such as heat-dissipating fans and heat-dissipating plates through thermally conductive sheets in order to efficiently dissipate heat. As the thermally conductive sheets, materials in which filling materials such as inorganic fillers are dispersed and contained in silicones are widely used.

A further improvement in thermal conductivity is required of such heat-dissipating members, and this is generally coped with by increasing the filling rate of the inorganic filler blended in the matrix for the purpose of high thermal conductivity. When the filling rate of the inorganic filler is increased, however, since the flexibility is impaired, and powder falling occurs due to the high filling rate of the inorganic filler, there is a limit to increasing the filling rate of the inorganic filler.

Examples of the inorganic filler include alumina, aluminum nitride, and aluminum hydroxide. Further for the purpose of high thermal conductivity, the matrix is filled with scaly particles of boron nitride, graphite, or the like, carbon fibers, or the like, in some cases. This relies on the anisotropy of the thermal conductivity of the scaly particles or the like. For example, in the case of carbon fibers, they have a thermal conductivity of about 600 W/mK to about 1,200 W/mK in the fiber direction. In the case of boron nitride, it has a thermal conductivity of about 110 W/mK in the plane direction and a thermal conductivity of about 2 W/mK in the direction perpendicular to the plane direction, and is known to have anisotropy.

The direction of the carbon fibers and the plane direction of the scaly particles are thus made to be the same as the thickness direction of the sheet, which is the heat transfer direction. That is, by orienting carbon fibers and scaly particles in the sheet thickness direction, the thermal conduction can be improved remarkably. However, in the case where when a cured product cured after being molded is sliced, the cured product cannot be sliced into a uniform thickness, irregularities of the sheet surface are large and catch in air, posing a problem that the excellent thermal conduction is not made the best use of.

In order to solve the problem, for example, Japanese Patent Application Laid-Open (JP-A) No. 2010-56299 proposes a thermally conductive rubber sheet prepared by stamping out and slicing with blades arranged at the same intervals in the perpendicular direction to the longitudinal direction of the sheet. Further JP-A No. 2010-50240 proposes that a thermally conductive sheet having a predetermined thickness is obtained by slicing, with a cutting device having a round rotating blade, a laminated body prepared by lamination by repeating coating and curing. Further JP-A No. 2009-55021 proposes that a laminated body prepared by laminating two or more layers of graphite layer containing anisotropic graphite particles is cut (at an angle of 90° with respect to the laminated plane) by using a metal saw so that an expandable graphite sheet is oriented at 0° with respect to the thickness direction of the obtained sheet. These proposed cutting methods, however, causes the surface roughness of the cut surface to become large and the thermal resistance at the interface to become high, posing a problem that the thermal conduction in the thickness direction decreases.

In recent years, there are desired thermally conductive sheets to be used by being interposed between various types of heat sources (various types of devices, for example, LSI, CPU, transistors, and LED) and heat-dissipating members. In order that such thermally conductive sheets fill up differences in gap between the various types of heat sources and the heat-dissipating members and cause them to closely adhere with each other, there are desired thermally conductive sheets which are compressible and soft.

Although the thermal conductivity of thermally conductive sheets is usually raised by filling a large amount of thermally conductive inorganic fillers (for example, see JP-A Nos. 2007-277406 and 2007-277405), when the filling amount of the inorganic fillers is made large, the sheets become hard and brittle. Further for example, in the case where silicone-based thermally conductive sheets filled with a large amount of inorganic fillers are placed in a high-temperature environment for a long time, such phenomena occur that the thermally conductive sheets become hard and the thickness become large, and the thermal resistance of the thermally conductive sheets in the load-applied time ends in rising.

SUMMARY OF THE INVENTION

The present invention has been proposed in consideration of such an actual situation, and has an object to provide a thermally conductive sheet excellent in the flexibility and good in the thermal conductivity in the thickness direction.

In order to solve the above-mentioned problem, a thermally conductive sheet according to the present invention contains a curable resin composition, thermally conductive fibers, and thermally conductive particles, and has a compressibility of 40% or more.

Further a thermally conductive sheet according to the present invention contains a curable resin composition, thermally conductive fibers, and thermally conductive particles, and has a filling amount of the thermally conductive particles and the thermally conductive fibers of 70% by volume or less.

Further a device according to the present invention contains a heat source, a heat-dissipating member, and the thermally conductive sheet interposed between the heat source and the heat-dissipating member.

The present invention, since the thermally conductive sheet has excellent flexibility, can improve the close adhesiveness by filling in differences in gap between various types of heat sources and heat-dissipating members and improve the thermal conductivity in the sheet thickness direction. Further in the case where the thermally conductive sheet is used for a long time in a high-temperature environment, since the close adhesiveness is improved, the thermal resistance can be reduced.

In one embodiment the present invention provide a thermally conductive sheet comprising:
 a curable resin composition;
 thermally conductive fibers; and
 thermally conductive particles,
 wherein the thermally conductive sheet has a thickness of more than 1.5 mm and 3.0 mm or less,
 wherein the thermally conductive sheet has a compressibility of 40% or more, and has a minimum value of a thermal resistance in a load range of 0.5 kgf/cm$^2$ or more and 3 kgf/cm$^2$ or less, and
 wherein the thermally conductive sheet has a peak value of a thermal conductivity of 15 W/mK or more in the compressibility thereof of 20% or less.

In one aspect the present invention provides, the thermally conductive sheet according to the present invention, wherein the thermally conductive sheet has a maximum compression stress of less than 780 N when the thermally conductive sheet is compressed by 40% at a rate of 25 mm/min or less.

In one aspect the present invention provides, the thermally conductive sheet according to the present invention, wherein the thermally conductive sheet has a residual stress of less than 204 N when the thermally conductive sheet is compressed by 40% at a rate of 25 mm/min or less and is held for 10 min in a state of being compressed by 40%.

In one aspect the present invention provides, the thermally conductive sheet according to the present invention, wherein the curable resin composition is a two-part addition reaction type liquid silicone resin of a silicone base resin and a curing agent; and the silicone base resin and the curing agent are blended at a ratio (silicone base resin:curing agent) of 5:5 to 6:4.

In one aspect the present invention provides, the thermally conductive sheet according to the present invention, wherein the thermally conductive fibers have an average fiber length of 50 µm or more and 250 µm or less.

In one aspect the present invention provides, the thermally conductive sheet according to the present invention, wherein the thermally conductive sheet has a peak value of a thermal conductivity of 20 W/mK or more in the compressibility thereof of 20% or less.

In one aspect the present invention provides, the thermally conductive sheet according to the present invention, wherein the thermally conductive sheet has a content of the thermally conductive particles and the thermally conductive fibers of 70% by volume or less.

In one aspect the present invention provides, the thermally conductive sheet according to the present invention, wherein the thermally conductive sheet is made by cutting a columnar cured product obtained by extruding a thermally conductive composition comprising the curable resin composition, the thermally conductive fibers and the thermally conductive particles, in a substantially perpendicular direction to a longitudinal direction of the columnar cured product.

In another embodiment the present invention provides a device comprising:
 a heat source;
 a heat-dissipating member; and
 the thermally conductive sheet according to claim 1 interposed between the heat source and the heat-dissipating member.

In one aspect the present invention provides, a device according to the present invention, wherein the thermally conductive sheet has a thermal resistance of less by 3% or more than an initial value of the thermal resistance of the thermally conductive sheet interposed between the heat source and the heat-dissipating member.

In another embodiment, the present invention provides a method for producing a thermally conductive sheet, the method comprising:
 extruding a thermally conductive composition comprising a curable resin composition, thermally conductive fibers and thermally conductive particles; and
 cutting an extruded columnar cured product in a substantially perpendicular direction to a longitudinal direction of the extruded columnar cured product to thereby obtain the thermally conductive sheet,
 wherein in the cutting, the extruded columnar cured product is cut to have a predetermined thickness of more than 1.5 mm and 3.0 mm or less so that the thermally conductive sheet exhibits a maximum compression stress of less than 780 N when the thermally conductive sheet is compressed by 40% at a rate of 25 mm/min or less, and the thermally conductive sheet has a peak value of a thermal conductivity of 15 W/mK or more in a compressibility thereof of 20% or less.

In one aspect the present invention provides, a method for producing a thermally conductive sheet according to the present invention, wherein in the cutting, the extruded columnar cured product is cut to have the predetermined thickness so that the thermally conductive sheet exhibits a residual stress of less than 204 N when the thermally conductive sheet is compressed by 40% at a rate of 25 mm/min or less and held for 10 min in a state of being compressed by 40%.

In one aspect the present invention provides, a method for producing a thermally conductive sheet according to the present invention, wherein in the cutting, the extruded columnar cured product is cut to have the predetermined thickness so that the thermally conductive sheet exhibits a thermal resistance of 2.0 K·cm$^2$/W or less in a load range of 0.5 kgf/cm$^2$ or more and 7.5 kgf/cm$^2$ or less.

In one aspect the present invention provides, a method for producing a thermally conductive sheet according to the present invention, which method further comprises pressing the thermally conductive sheet cut in the substantially perpendicular direction, wherein
 the pressing is carried out so that the thermally conductive sheet has a thermal resistance of 2.0 K·cm$^2$/W or less in a load range of 0.5 kgf/cm$^2$ or more and 7.5 kgf/cm$^2$ or less.

In one aspect the present invention provides, a method for producing a thermally conductive sheet according to the present invention, wherein the pressing is carried out at a pressure of 0.1 MPa or more and 30 MPa or less.

In one aspect the present invention provides, a method for producing a thermally conductive sheet according to the present invention, wherein the pressing is carried out at a temperature of room temperature or more and 140° C. or less.

In another embodiment the present invention provides a thermally conductive sheet which is obtained by the method for producing a thermally conductive sheet according to the method of the present invention.

In another embodiment the present invention provides a device comprising:
 a heat source;
 a heat-dissipating member; and the thermally conductive sheet according to claim 17 interposed between the heat source and the heat-dissipating member.

In another embodiment the present invention provides a device according to the present invention, wherein the thermally conductive sheet has a thermal resistance of less by 3% or more than an initial value of the thermal resistance of the thermally conductive sheet interposed between the heat source and the heat-dissipating member.

BRIEF DESCRIPTION OF THE DRAWINGS

FIG. 4 is a flow chart for explaining one example of an arrangement step in another method for producing a thermally conductive sheet according to the present invention.

DETAILED DESCRIPTION OF THE INVENTION

Figure 1:
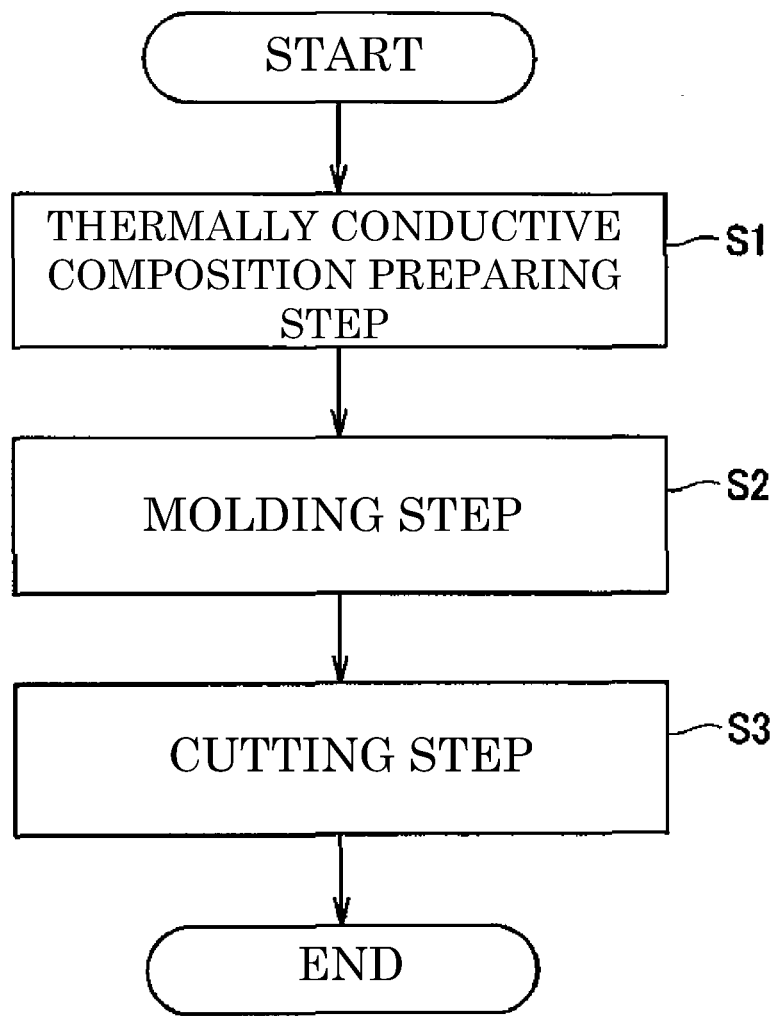
FIG. 1 is a flow chart for explaining one example of a method for producing a thermally conductive sheet according to the present invention.

Hereinafter, an embodiment according to the present invention (hereinafter, referred to as the present embodiment) will be described in detail in the following order with reference to the Drawings.

1. A thermally conductive sheet
2. A method for producing the thermally conductive sheet
3. Another method for producing the thermally conductive sheet
4. Examples

1. A THERMALLY CONDUCTIVE SHEET

Hereinafter, there will be described a curable resin composition, thermally conductive fibers, thermally conductive particles and the like constituting a thermally conductive sheet according to the present embodiment.

The thermally conductive sheet according to the present embodiment contains a curable resin composition, thermally conductive fibers and thermally conductive particles, and has a compressibility of 40% or more.

Further the thermally conductive sheet according to the present embodiment contains a curable resin composition, thermally conductive fibers and thermally conductive particles, and has a filling amount of the thermally conductive particles and the thermally conductive fibers of 70% by volume or less.

Specifically, in the case where the filling amount of the thermally conductive particles and the thermally conductive fibers is made to be 70% by volume or less, and the curable resin composition to be used is a two-part addition reaction type liquid silicone resin of a silicone base resin and a curing agent, by making the blend ratio (the silicone base resin:the curing agent) of the silicone base resin to the curing agent to be 5:5 to 6:4, the compressibility of the thermally conductive sheet can be made to be 40% or more.

When the compressibility of the thermally conductive sheet is 40% or more, the close adhesiveness is improved by filling up differences in gap between various types of heat sources and heat-dissipating members, and the thermal conductivity in the sheet thickness direction can be then improved. Further in the case where the thermally conductive sheet is used for a long time in a high-temperature environment, since the close adhesiveness is improved, the thermal resistance can be reduced.

Further the thermally conductive sheet preferably has a thermal conductivity peak value of 15 W/mK or more, and more preferably has that of 20 W/mK or more, at a compressibility of 40% or less. Thereby, in a compression state where a load is applied on the thermally conductive sheet, the excellent thermal conductivity can be attained.

Further the thermally conductive sheet preferably has a minimum value of the thermal resistance in the load range of 0.5 kgf/cm$^2$ or more and 3 kgf/cm$^2$ or less. That is, the thermal resistance value of the thermally conductive sheet becomes lower, and becomes higher after taking the minimum value, as the load is applied in the load range of 0.5 kgf/cm$^2$ or more and 3 kgf/cm$^2$ or less. Thereby, for example, in the case where the thermally conductive sheet together with a heat-dissipating member is installed on a heat-generating body such as an electronic component on a substrate, the heat-generating body and the heat-dissipating member can be closely adhered by a low load, and the excellent thermal conductivity can be then attained. Further since they can be installed on the substrate by a low load, risks of breakage of the substrate and the like can be reduced.

Further it is preferable that the thickness of the thermally conductive sheet is 3.0 mm or less, and the maximum compression stress when the thermally conductive sheet is compressed by 40% at a rate of 25 mm/min or less is 1,000 N or less. When the maximum compression stress is low, since the load onto a substrate in the installation is reduced, risks of breakage of the substrate and the like can be reduced. Here, when the thickness of the thermally conductive sheet is large and the compression rate is low, the maximum compression stress becomes low.

Further it is preferable that the thickness of the thermally conductive sheet is 3.0 mm or less and the residual stress when the thermally conductive sheet is compressed by 40% at a rate of 25 mm/min or less and held for 10 min in the state of being compressed by 40% is 220 N or less. When the residual stress is low, the stress exerted on a substrate in the long-term utilization can be reduced.

Curable Resin Composition

The curable resin composition is not especially limited, and can suitably be selected according to the performance required for the thermally conductive sheet; for example, a thermoplastic polymer or a thermosetting polymer can be used.

The thermoplastic polymer includes thermoplastic resins, thermoplastic elastomers and polymer alloys thereof.

The thermoplastic resin is not especially limited, and can suitably be selected according to the purpose; examples thereof include ethylene-α-olefin copolymers such as polyethylene, polypropylene and ethylene propylene copolymers, polymethylpentene, polyvinyl chloride, polyvinylidene chloride, polyvinyl acetate, ethylene-vinyl acetate copolymers, polyvinyl alcohol, polyacetal, fluororesins such as polyvinylidene fluoride and polytetrafluoroethylene, polyethylene terephthalate, polybutylene terephthalate, polyethylene naphthalate, polystyrene, polyacrylonitrile, styrene-acrylonitrile copolymers, acrylonitrile-butadiens-styrene (ABS) resins, polyphenylene ether, modified polyphenylene ether, aliphatic polyamides, aromatic polyamides, polyamidoimide, polymethacrylic acid or esters thereof, polyacrylic acid or esters thereof, polycarbonate, polyphenylene sulfide, polysulfone, polyether sulfone, polyether nitrile, polyether ketone, polyketone, liquid crystal polymers, silicone resins, and ionomers. One of these may be used alone, or two or more of these may be used in combination.

Examples of the thermoplastic elastomer include styrenic thermoplastic elastomers such as styrene-butadiene copolymers or hydrogenated polymers thereof, and styrene-isoprene block copolymers or hydrogenated polymers thereof, olefinic thermoplastic elastomers, vinyl chloride-based thermoplastic elastomers, polyester-based thermoplastic elastomers, polyurethane-based thermoplastic elastomers, and polyamide-based thermoplastic elastomers. One of these may be used alone, or two or more of these may be used in combination.

Examples of the thermosetting polymer include crosslinking rubbers, epoxy resins, polyimide resins, bismaleimide resins, benzocyclobutene resins, phenol resins, unsaturated polyesters, diallyl phthalate resins, silicone resins, polyurethanes, polyimide silicones, thermosetting polyphenylene ethers, and thermosetting modified polyphenylene ethers. One of these may be used alone, or two or more of these may be used in combination.

Examples of the crosslinking rubber include natural rubbers, butadiene rubbers, isoprene rubbers, nitrile rubbers, hydrogenated nitrile rubbers, chloroprene rubbers, ethylene propylene rubbers, chlorinated polyethylene, chlorosulfonated polyethylene, butyl rubbers, halogenated butyl rubbers, fluororubbers, urethane rubbers, acrylic rubbers, polyisobutylene rubbers, and silicone rubbers. One of these may be used alone, or two or more of these may be used in combination.

A method for curing the curable resin composition is not especially limited, and can suitably be selected according to the performance required for the thermally conductive sheet; and there can be used, for example, a curing agent mixing type one, a solvent volatilization type one, a thermal curing type one, a thermal melting type one, and an ultraviolet curing type one.

In the present embodiment, from the viewpoint of being excellent in molding processability and weather resistance, and the close adhesiveness and conformability to electronic parts, curing agent mixing type silicone resins are preferably used. The silicone resins are not especially limited and can suitably be selected according to the purpose; examples thereof include addition reaction type liquid silicone rubbers and heat-vulcanizable millable type silicone rubbers using a peroxide for vulcanization. Among these, addition reaction type liquid silicone rubbers are especially preferable because as heat-dissipating members of electronic devices, the close adhesiveness between the heat-generating surfaces of electronic parts and heat sink surfaces is required.

In the case where as the curable resin composition, a two-part addition reaction type liquid silicone resin of a silicone base resin and a curing agent is used, by making the blend ratio (silicone base resin:curing agent) of the silicone base resin to the curing agent to be 5:5 to 6:4, the compressibility of the thermally conductive sheet can be made to be 40% or more.

The content of the curable resin composition in the thermally conductive sheet is not especially limited, but can be made to be, for example, 25% by volume or more and 45% by volume or less.

Thermally Conductive Fiber

As the thermally conductive fiber, for example, carbon fibers can be used. As the carbon fibers, there can be used, for example, pitch-based carbon fibers, PAN-based carbon fibers, and carbon fibers synthesized by an arc discharge method, a laser evaporation method, a CVD method (chemical vapor deposition method), a CCVD method (catalytic chemical vapor deposition method), or the like. Among these, pitch-based carbon fibers and carbon fibers obtained by graphitizing polybenzazole are especially preferable from the viewpoint of thermal conduction.

The pitch-based carbon fibers are obtained by using a pitch as a main raw material and subjecting the pitch to treatment steps such as melt spinning, infusibilization and carbonization followed by heat treatment at a high temperature of 2,000° C. to 3,000° C. or more than 3,000° C. for graphitization. The raw material pitch is classified into isotropic pitch which is optically disordered and exhibits no deflection and anisotropic pitch (mesophase pitch) in which the constituent molecules are arranged like a liquid crystal and which exhibits optical anisotropy. Carbon fibers made from the anisotropic pitch have better mechanical properties and higher electrical and thermal conductivities than carbon fibers made from the isotropic pitch. Therefore, mesophase pitch-based graphitized carbon fibers are preferably used.

The carbon fibers, as required, can be subjected partially or wholly to surface treatment and used. Examples of the surface treatment include oxidation treatment, nitriding treatment, nitration, sulfonation, or treatments in which a metal, a metal compound, an organic compound or the like is attached or bonded to functional groups introduced onto the surfaces by these treatments or to the surfaces of the carbon fibers. Examples of the functional group include a hydroxyl group, a carboxyl group, a carbonyl group, a nitro group, and an amino group.

The average fiber length of the thermally conductive fibers is preferably 50 μm or more and 250 μm or less, and more preferably 100 μm or more and 250 μm or less. By making the average fiber length of the thermally conductive fibers to be 50 μm or more and 250 μm or less, the thermally conductive fibers become easily entangled with one another, and thus the thermal conductivity in the thickness direction of the thermally conductive sheet can be made better. Further in the state of the thermally conductive sheet being compressed, an excellent thermal conductivity peak value can be obtained. Further in order to regulate the average fiber length, carbon fibers having different average fiber lengths may be mixed. The average fiber length of the thermally conductive fibers can be measured, for example, by a particle size distribution meter, a microscope, a scanning electron microscope (SEM), or the like. Further the average diameter of the thermally conductive fibers is preferably 5 μm or more and 20 μm or less.

The content of the thermally conductive fibers in the thermally conductive sheet is made to be preferably 15% by volume or more and 40% by volume or less. By making the content of the thermally conductive fibers to be 15% by volume or more, since the thermal resistance value can be more effectively lowered, the thermal conductivity in the thickness direction of the thermally conductive sheet can be made better. Further by making the content of the thermally conductive fibers to be 40% by volume or less, for example, when the thermally conductive composition is extruded by an extruder, the extrusion can be prevented from becoming difficult.

Thermally Conductive Particle

The thermally conductive particles make it easy for thermally conductive fibers to be aligned in a predetermined direction, due to differences in flow velocity from the thermally conductive fibers in the thermally conductive composition, that is, the thermally conductive particles are used in order to make it easy for the thermally conductive fibers to be oriented along the extrusion direction. Further the thermally conductive particles are also used in order to maintain the shape of the thermally conductive sheet.

As the thermally conductive particles, there can be used, for example, alumina, aluminum nitride, aluminum hydroxide, silica, boron nitride, titania, glass, zinc oxide, silicon carbide, silicon, silicon oxide, aluminum oxide and metal particles. One of these may be used alone, or two or more of these may be used in combination. Among these, there is preferably used one or more thereof containing at least alumina out of alumina, aluminum nitride and aluminum hydroxide.

The aluminum nitride has nitrogen in its molecule, and this nitrogen inhibits the reaction of the curable resin composition to thereby suppress an increase in the viscosity of the thermally conductive composition. Therefore, by using aluminum nitride, as compared with when alumina particles alone are used as the thermally conductive particles, the thermally conductive fibers can be more effectively oriented along the thickness direction of the thermally conductive sheet, and thus the thermal conductivity in the thickness direction of the thermally conductive sheet can be made good.

Further the thermally conductive particles are preferably surface-treated, for example, with a silane coupling agent.

By surface-treating the thermally conductive particles, the dispersibility can be improved and the flexibility of the thermally conductive sheet can be improved. Further the surface roughness obtained by slicing can be made smaller.

The average particle diameter of the thermally conductive particles is preferably 0.5 µm or more and 10 µm or less. When the average particle diameter is less than 0.5 poor curing is caused in some cases; when the average particle diameter is more than 10 the flexibility of the thermally conductive sheet decreases and the thermal conductivity of a cured product decreases in some cases.

Further by using the thermally conductive particles having two or more different particle diameters, the thermally conductive fibers can be more effectively easily oriented along the thickness direction of the thermally conductive sheet, and thus the thermal conductivity in the thickness direction of the thermally conductive sheet can be made better. When the thermally conductive particles having two or more different particle diameters are used, it is preferable that the large globular particles are made to be 3 µm or more and 10 µm or less, and the small globular particles is made to be 0.3 µm or more and 3 µm or less. Thereby, the thermally conductive fibers can be more effectively easily oriented along the thickness direction of the thermally conductive sheet, and thus the thermal conductivity in the thickness direction of the thermally conductive sheet can be made good. Here, the average particle diameter of the thermally conductive particles can be measured, for example, by a particle size distribution meter or a scanning electron microscope (SEM).

The content of the thermally conductive particles in the thermally conductive sheet is preferably 70% by volume or less, and more preferably 20% by volume or more and 60% by volume or less. By making the content of the thermally conductive particles to be 70% by volume or less, the excellent flexibility can be obtained and the thermal conductivity in the thickness direction of the thermally conductive sheet can be made better.

Further in the above-mentioned thermally conductive composition, as required, there can be blended other components, for example, a solvent, a thixotropy-imparting agent, a dispersant, a curing agent, a curing accelerator, a retarder, a slight tackiness-imparting agent, a plasticizer, a flame retardant, an antioxidant, a stabilizer and a colorant.

Further the thickness of the thermally conductive sheet is preferably 0.1 mm or more. When the thickness of the thermally conductive sheet is less than 0.1 mm, the shape cannot be maintained during slicing in some cases, though depending on the hardness of a cured product. A tacky layer can also be formed in a dot shape or a line shape on an obtained sheet or on the outer periphery thereof.

It is desirable that such a thermally conductive sheet is interposed between a heat source and a heat-dissipating member. Examples of the heat source include LSI, CPU, transistors and LED; and it is preferable that the thermally conductive sheets are used for communication devices in which the thermally conductive sheets are interposed between LSI for communication and heat-dissipating members, computers in which the thermally conductive sheets are interposed between CPU for the computers and heat-dissipating members, and for others.

The thermally conductive sheet according to the present embodiment, since having excellent flexibility, and being improved in the close adhesiveness with the lapse of time, can reduce the thermal resistance of the thermally conductive sheet interposed between a heat source and a heat-dissipating member by 3% or more from the initial value thereof.

2. A METHOD FOR PRODUCING THE THERMALLY CONDUCTIVE SHEET

Then, a method for producing the above-mentioned thermally conductive sheet will be described. The method for producing the thermally conductive sheet according to the present embodiment has a thermally conductive composition preparing step S1, a molding step S2, and a cutting step S3, as shown in FIG. 1.

Thermally Conductive Composition Preparing Step S1

In the thermally conductive composition preparing step S1, a curable resin composition, thermally conductive fibers, thermally conductive particles, and the like are mixed using a mixer or the like to thereby prepare the above-mentioned thermally conductive composition. For example, it is preferable that the blend amounts of the thermally conductive fibers and the thermally conductive particles in the composition for forming the thermally conductive sheet are 16% by volume or more and 40% by volume or less, and 30% by volume or more and 60% by volume or less, respectively, and the thermally conductive fibers are preferably carbon fibers having an average diameter of 5 µm to 20 µm, and an average fiber length of 50 µm to 250 µm.

Molding Step S2

In the molding step S2, the thermally conductive composition fabricated in the thermally conductive composition preparing step S1 is extruded into a mold by using a pump, an extruder or the like to thereby obtain a columnar cured product. The shape, size, material and the like of the mold are not especially limited, and can suitably be selected according to the purpose. Examples of the shape include hollow cylindrical shapes and hollow prismatic shapes. The size can suitably be selected according to the size of the thermally conductive sheet to be fabricated. Examples of the material include stainless steel.

The molded body extruded is subjected to a curing reaction suitable according to the resin used to thereby make a cured product. A method for curing the extruded body is not especially limited and can suitably be selected according to the purpose. For example, in the case where a thermosetting resin such as a silicone resin is used as the curable resin composition, the extruded body is preferably cured by heating.

Examples of an apparatus to be used for heating include far-infrared furnaces and hot air furnaces. The heating temperature is not especially limited and can suitably be selected according to the purpose, but heating is preferably carried out, for example, at 40° C. to 150° C. The flexibility of the cured product is not especially limited, and can suitably be selected according to the purpose, and can be regulated, for example, by the crosslinking density of the silicone, the filling amounts of the thermally conductive fillers, and the like.

Figure 2:
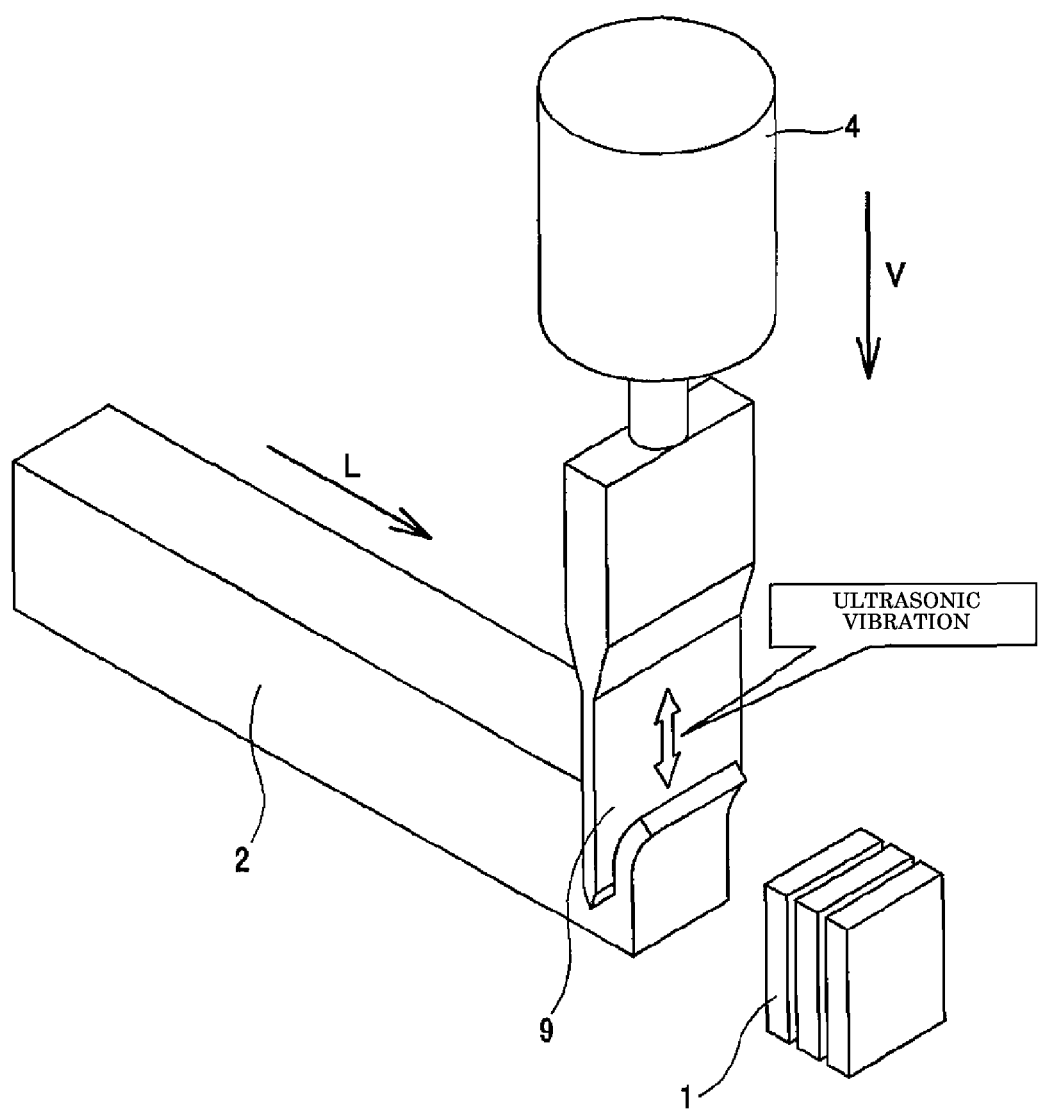
FIG. 2 is an appearance diagram showing one example of an ultrasonic cutting machine used in a cutting step in a method for producing a thermally conductive sheet according to the present invention.

Thus, there can be formed, for example, a columnar thermally conductive composition in which thermally conductive fibers are oriented in the columnar longitudinal direction L as shown in FIG. 2. In a process in which a thermally conductive composition passes through a mold by an extruder or the like, the thermally conductive fibers, the thermally conductive particles and the like are gathered toward the central direction of the thermally conductive composition to thereby make such a state that the density of the thermally conductive fibers is different between the surface and the center. That is, since the thermally conductive fibers do not protrude on the surface of the thermally conductive composition (molded body) which has passed through the extruder, the surface portion (the outer peripheral portion in the thermally conductive sheet) of the cured product obtained by curing the thermally conductive composition (molded body) has good slight tackiness and has good adhesiveness to adherends (semiconductor apparatuses and the like). By contrast, the surfaces which come into contact with heat sources or heat-dissipating members, since the thermally conductive fibers protrude on the surface, are reduced in the slight tackiness.

Here, the slight tackiness means having repeelability with only a little rise in the adhesive force due to the lapse of time and the moist heat, and having tackiness in such a degree that in the case where the thermally conductive composition is attached on an adherend, the attaching position does not easily shift.

In the molding step S2, for example, the thermally conductive composition made in the thermally conductive composition preparing step S1 may be applied to a polyester film to which a release material has been applied to thereby form a columnar thermally conductive composition as shown in FIG. 2.

Cutting Step S3

Figure 3:
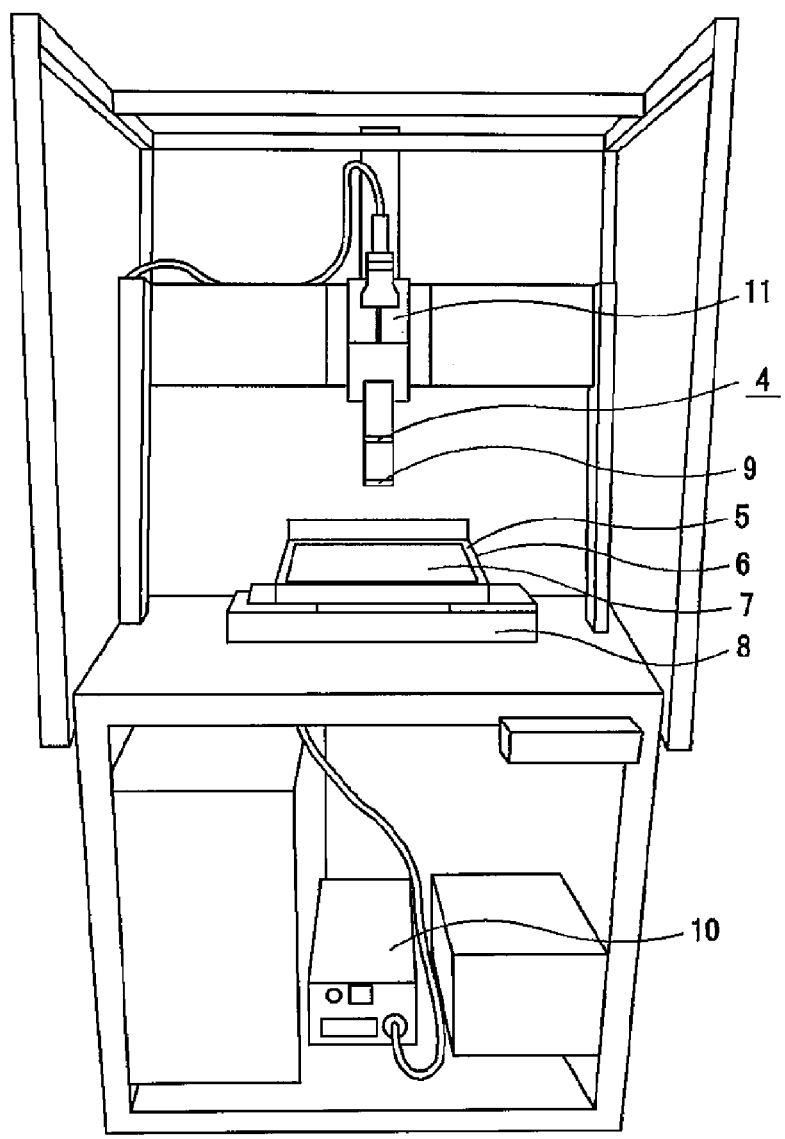
FIG. 3 is an appearance diagram showing one example of a slicing apparatus.

The cutting step S3 is a step of cutting the columnar cured product in the direction substantially perpendicular to the length direction of the column into a predetermined thickness. For example, as shown in FIG. 2 and FIG. 3, by slicing a columnar thermally conductive composition 2 in the direction V orthogonal to the longitudinal direction L of the columnar thermally conductive composition 2 by an ultrasonic cutter 4 using an ultrasonic cutting machine 3, a thermally conductive sheet 1 can be formed in such a state that the orientation of thermally conductive fibers is kept. Therefore, there can be obtained the thermally conductive sheet 1 in which the orientation of the thermally conductive fibers is maintained in the thickness direction and which has a good thermal conduction property.

In the cutting step S3, it is preferable that the cutting is carried out into a predetermined thickness so that the maximum compression stress when the compression is carried out by 40% at a rate of 25 mm/min or less becomes 1,000 N or less. In the cutting step S3, it is also preferable that the cutting is carried out into a predetermined thickness so that the residual stress when the compression is carried out by 40% at a rate of 25 mm/min or less and is then held for 10 min in the compression state of 40% becomes 220 N or less. In the cutting step S3, it is also preferable that the cutting is carried out into a predetermined thickness so that the thermal resistance becomes 2.0 K·cm²/W or less in the load range of 0.5 kgf/cm² or more and 7.5 kgf/cm² or less. In the cutting step S3, it is also preferable that the cutting is carried out so that the thickness becomes 3.0 mm or less. Thereby, the thermally conductive sheet can be obtained which is excellent in flexibility, low in resilience and excellent in the conformability to installation places.

The ultrasonic cutting machine 3 includes, as shown in FIG. 3, a work table 5 on which the columnar thermally conductive composition 2 is to be placed, and the ultrasonic cutter 4 for slicing the columnar thermally conductive composition 2 on the work table 5 while applying ultrasonic vibration.

In the work table 5, a silicone rubber 7 is disposed on a metallic movable carriage 6. The movable carriage 6 is movable in a predetermined direction by a moving mechanism 8 and operates to sequentially feed the columnar thermally conductive composition 2 to below the ultrasonic cutter 4. The silicone rubber 7 has a thickness enough to receive the cutting edge of the ultrasonic cutter 4. On the work table 5, when the columnar thermally conductive composition 2 is placed on the silicone rubber 7, the movable carriage 6 is moved in the predetermined direction according to the slicing operation of the ultrasonic cutter 4 and sequentially feeds the columnar thermally conductive composition 2 to below the ultrasonic cutter 4.

The ultrasonic cutter 4 has a knife 9 for slicing the columnar thermally conductive composition 2, an ultrasonic oscillation mechanism 10 for imparting ultrasonic vibration to the knife 9, and a raising and lowering mechanism 11 for operating to raise and lower the knife 9.

The cutting edge of the knife 9 is directed to the work table 5, and the knife 9 slices the columnar thermally conductive composition 2 placed on the work table 5 by being operated to be raised and lowered by the raising and lowering mechanism 11. The knife 9 can use a single edge or a double edge capable of ultrasonic oscillation. For the double edge, when the double edge is lowered perpendicularly to the molded body, since the thickness of the sliced sheet results in being inclined in the plane, it is necessary to tilt the double edge so that the cutting edge of the double edge is perpendicular to the molded body. The angle of the tilt is half the angle of the cutting edge of the double edge. The dimensions and material of the knife 9 are determined according to the size, composition and the like of the columnar thermally conductive composition 2, and the knife 9 is formed, for example, of steel having a width of 40 mm, a thickness of 1.5 mm and an edge angle of 10°. Then, by curing the obtained molded body and then cutting the cured product so that the edge cuts in perpendicularly to the cured product, since the cured product can be cut into a uniform thickness, and the surface roughness of the cut surface can be made small, the thermal resistance at the interface lowers, and a thermally conductive sheet having a high thermal conduction in the thickness direction of the sheet can be fabricated. Here, the surface roughness Ra can be measured, for example, by a laser microscope.

The ultrasonic oscillation mechanism 10 imparts ultrasonic vibration to the knife 9 in the slicing direction of the columnar thermally conductive composition 2, and it is preferable that the oscillation frequency is regulated in the range of 10 kHz to 100 kHz, and the amplitude is regulated in the range of 10 μm to 100 μm.

The thermally conductive sheet 1 sliced by the ultrasonic cutting machine 3 while the ultrasonic vibration is being imparted by the ultrasonic cutting machine 3, as compared with a thermally conductive sheet sliced without ultrasonic vibration being imparted, is suppressed low in the thermal resistance. This is due to that since the ultrasonic cutting machine 3 imparts ultrasonic vibration in the slicing direction to the ultrasonic cutter 4, the interfacial thermal resistance is low, and the thermally conductive fibers oriented in the thickness direction of the thermally conductive sheet 1 are hardly toppled sideways by the knife 9. On the other hand, in the thermally conductive sheet sliced without the ultrasonic vibration being imparted, the orientation of the thermally conductive fibers is disturbed by the frictional resistance of the knife, so that the exposure of the thermally conductive fibers to the cut surface decreases, and the thermal resistance therefore increases. Therefore, by using the ultrasonic cutting machine 3, the thermally conductive sheet 1 having the excellent thermal conduction property can be obtained.

By cutting the molded body in which the curing reaction has been thus completed, in the direction perpendicular to the extrusion direction into a predetermined thickness, there can be obtained a thermally conductive sheet in which thermally conductive fibers are oriented in the thickness direction of the thermally conductive sheet (perpendicularly oriented). The thickness of the thermally conductive sheet is preferably 0.1 mm or more. When the thickness is less than 0.1 mm, the shape cannot be maintained during slicing in some cases, though depending on the hardness of the cured product. Further during slicing, the molded body may be sliced while the temperature is regulated by cooling, heating or the like. Further the molded body may be sliced while the blade is being cooled.

The production method further has a pressing step of pressing the thermally conductive sheet cut substantially in the perpendicular direction; and in the pressing step, the pressing is preferably carried out so that the thermal resistance becomes 2.0 K·cm$^2$/W or less in the load range of 0.5 kgf/cm$^2$ or more and 7.5 kgf/cm$^2$ or less. Further in the pressing step, the pressing is preferably carried out at a pressure of 0.1 MPa or more and 30 MPa or less. Further in the pressing step, the pressing is preferably carried out at a temperature of room temperature or more and 140° C. or less. In the case where the thermally conductive sheet is pressed, although it is conceivable that since the density thereof rises and the thermally conductive sheet becomes hard due to the compression, the maximum compression stress becomes high, the pressing under the above-mentioned pressing condition enables the maximum compression stress to be low. The maximum compression stress becomes low conceivably because oil components in the thermally conductive sheet bleed on the sheet surface by the pressing and the slippability becomes good.

3. ANOTHER METHOD FOR PRODUCING THE THERMALLY CONDUCTIVE SHEET

The thermally conductive sheet 1 may be fabricated by the following production method. That is, as shown in FIG. 4, the above-mentioned molding step S2 of the method for producing the thermally conductive sheet may have a temporary molding step S21, an alignment step S22, and a full molding step S23. In the following description, the detailed description of the above-mentioned thermally conductive composition preparing step S1 and cutting step S3 will be omitted.

Temporary Molding Step S21

Figure 5A:
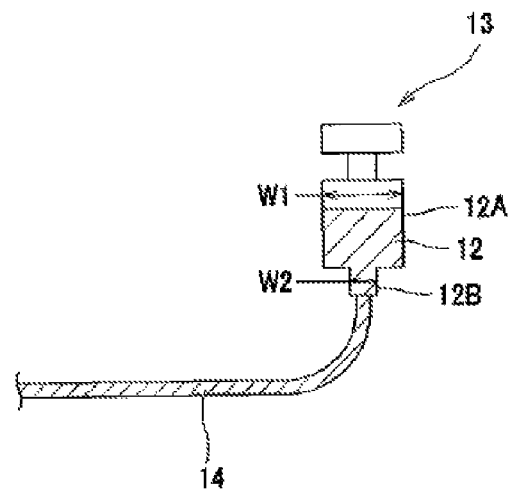
FIG. 5A is a schematic diagram for explaining one example of a temporary molding step in a method for producing a thermally conductive sheet according to the present invention.

In the temporary molding step S21, as shown in FIG. 5A, the thermally conductive composition 12 fabricated in the thermally conductive composition preparing step S1 is extruded by an extruder 13 to thereby mold a slender columnar temporarily molded body 14 (hereinafter, referred to as a temporarily molded body 14) in which thermally conductive fibers are oriented along the extrusion direction.

The extruder 13 is constituted, for example, as shown in FIG. 5A, in a slender cylinder shape, in which the bore diameter W2 of an opening 12B on the side on which the thermally conductive composition 12 is discharged is preferably reduced more than the inner diameter W1 of a main body 12A. Further in the extruder 13, the inner diameter W1 of the main body 12a may be reduced in a tapered manner from a predetermined position in the longitudinal direction toward the extrusion direction and the bore diameter W2 of the opening 12B may be reduced more than the inner diameter W1 of the main body 12A. By extruding the thermally conductive composition 12 by such an extruder 13 and causing the thermally conductive composition 12 to pass toward the portion where the diameter is reduced more than the inner diameter W1 of the main body 12A in the extruder 13, the thermally conductive fibers are made to easily follow the extrusion direction. Thus, the thermally conductive fibers can be more reliably oriented in the longitudinal direction of the temporarily molded body 14.

In the extruder 13, for example, when the content of the thermally conductive fibers in the thermally conductive composition 12 is 15% by volume or more and 25% by volume or less, the bore diameter W2 of the opening 12B is preferably made to be about 1.5 mm to about 9.5 mm. In this case, by making the bore diameter W2 of the opening 12B to be 1.5 mm or more, the extrusion can be prevented from becoming difficult when the thermally conductive composition 12 is extruded by the extruder 13. Further by making the bore diameter W2 of the opening 12B to be 9.5 mm or less, since the orientation of the thermally conductive fibers are made to be hardly disturbed, the thermal conductivity in the thickness direction of the thermally conductive sheet 1 can be made better.

In the extruder 13, the cross-sectional shape of the opening 12B can be, for example, a circular shape, a triangular shape, a rectangular shape, or a square shape but is preferably a rectangular shape or a square shape. By making the cross-sectional shape of the opening 12B a rectangular shape or a square shape, the temporarily molded body 14 has a prismatic shape. Therefore, in the alignment step S22, when a plurality of the temporarily molded bodies 14 are aligned so as to be adjacent to one another in the direction orthogonal to the longitudinal direction of the temporarily molded bodies 14 to thereby obtain a laminated body 14A (hereinafter, referred to as a laminated body 14A) in which the plurality of the temporarily molded bodies 14 aligned are disposed in the direction substantially orthogonal to the alignment direction, it becomes difficult for gaps to be formed in the laminated body 14A. Thus, since bubbles are made to be hardly contained in the laminated body 14A, a fully molded body 16 having better flame retardancy can be obtained in the full molding step S23.

In the temporarily molded body 14, the thermally conductive fibers are oriented along the extrusion direction by the extruder 13, and the temporarily molded body 14 has a slender columnar shape, for example, a slender quadrangular prism shape, a slender triangular prism shape, or a slender cylinder shape.

Alignment Step S22

Figure 5B:
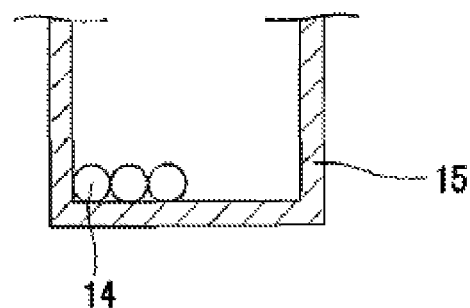
FIG. 5B is a schematic diagram for explaining one example of an alignment step in a method for producing a thermally conductive sheet according to the present invention (part 1).
Figure 5C:
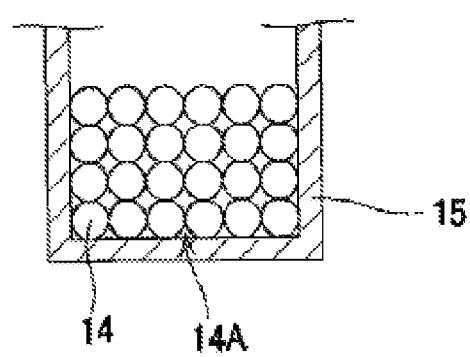
FIG. 5C is a schematic diagram for explaining one example of an alignment step in a method for producing a thermally conductive sheet according to the present invention (part 2).
Figure 6:
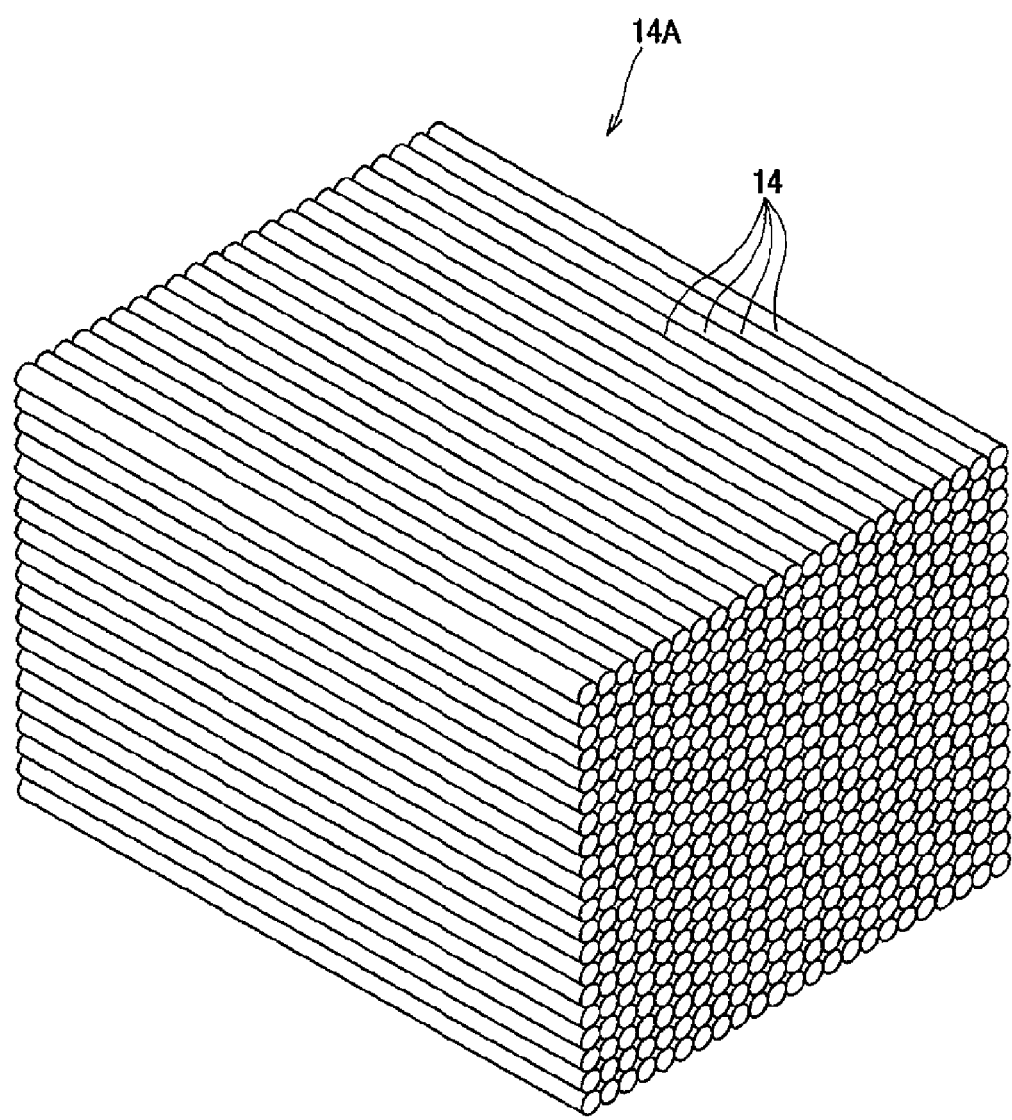
FIG. 6 is a perspective view showing one example of a laminate obtained in the alignment step in a method for producing a thermally conductive sheet according to the present invention.

In the alignment step S22, for example, as shown in FIG. 5B, FIG. 5C and FIG. 6, the plurality of the temporarily molded bodies 14 molded in the temporary molding step S21 are aligned so as to be adjacent to one another in the direction orthogonal to the longitudinal direction of the temporarily molded bodies 14 to thereby obtain the laminated body 14A. In the alignment step S22, for example, the temporarily molded bodies 14 are aligned in a predetermined frame 15 to thereby obtain the laminated body 14A in which the temporarily molded bodies 14 are disposed in a rectangular parallelepiped shape or a cube shape. The frame 15 is used as a fixing unit for fixing the laminated body 14A when a fully molded body 16 is molded in the full molding step S23, and prevents the laminated body 14A from being deformed largely. The frame 15 is formed, for example, of a metal.

Full Molding Step S23

Figure 5D:
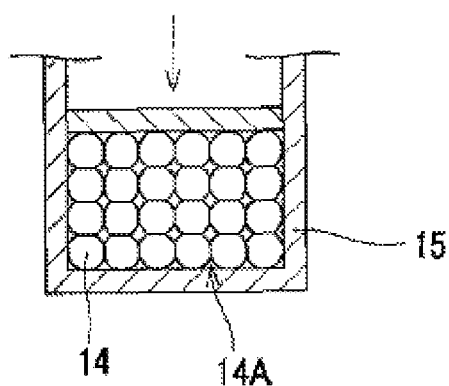
FIG. 5D is a schematic diagram for explaining one example of a full molding step in a method for producing a thermally conductive sheet according to the present invention.
Figure 5E:
FIG. 5E is a schematic diagram of a fully molded body obtained by a method for producing a thermally conductive sheet according to the present invention (a method illustrated in FIGS. 5A to 5D).
Figure 7A:
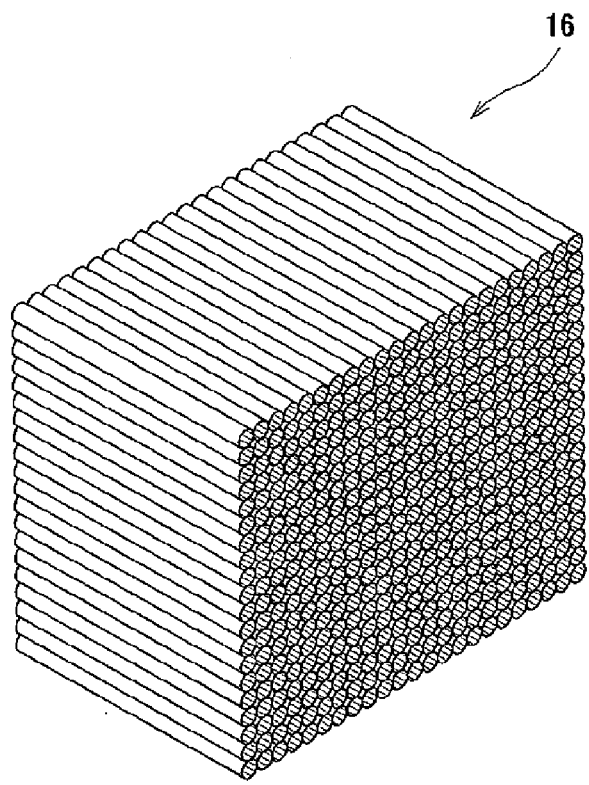
FIG. 7A is a perspective view showing one example of a fully molded body not subjected to pressing.
Figure 7B:
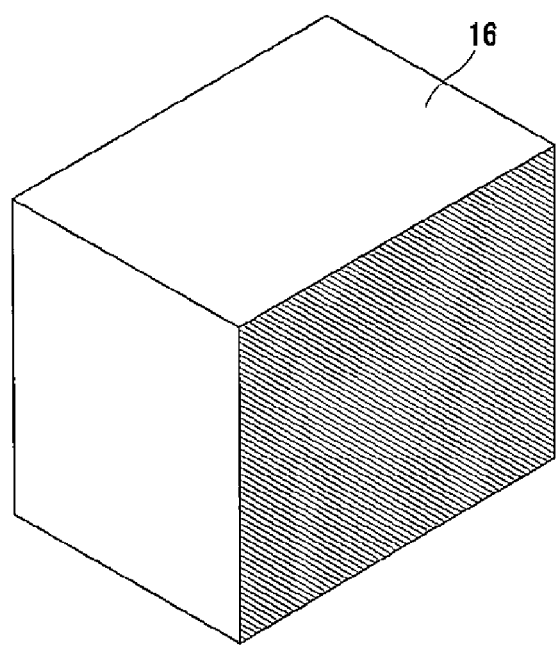
FIG. 7B is a perspective view showing one example of a fully molded body subjected to pressing.
Figure 8:
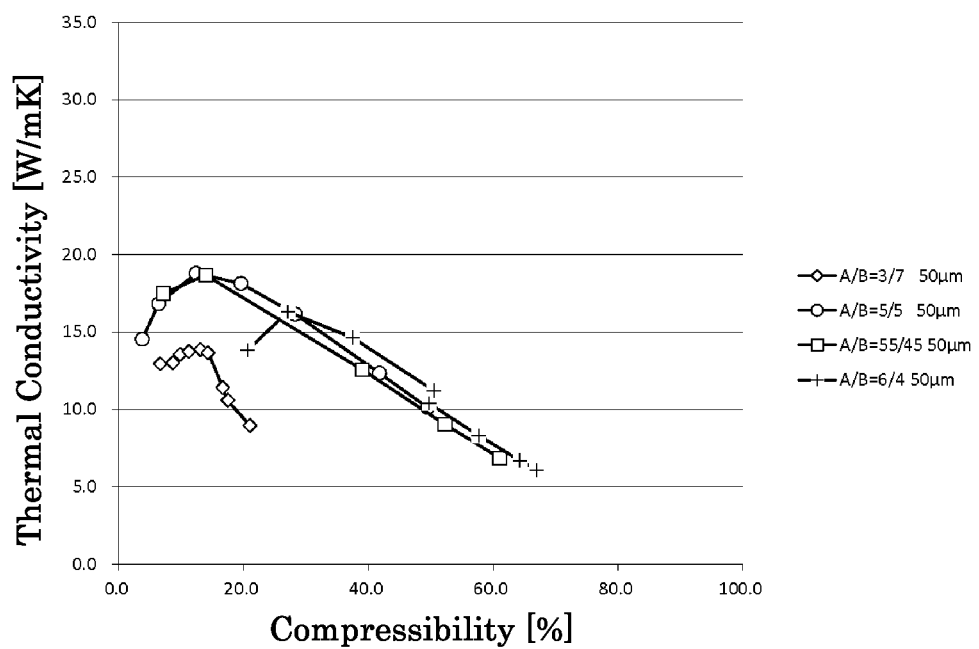
FIG. 8 is a graph showing the thermal conductivity vs. the compressibility of a thermally conductive sheet when the carbon fiber length is 50 μm.
Figure 9:
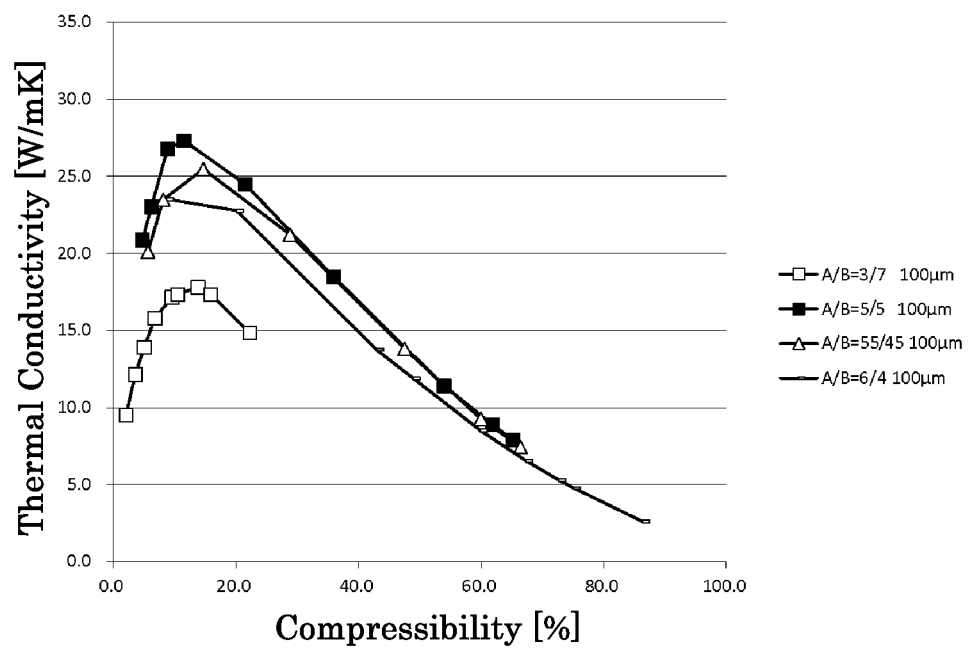
FIG. 9 is a graph showing the thermal conductivity vs. the compressibility of a thermally conductive sheet when the carbon fiber length is 100 μm.
Figure 10:
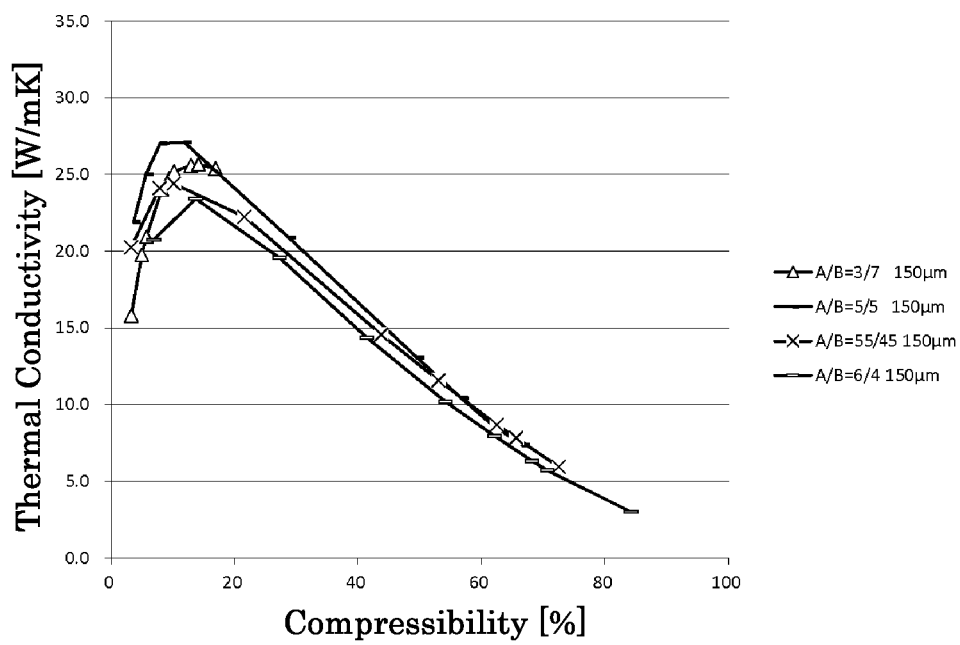
FIG. 10 is a graph showing the thermal conductivity vs. the compressibility of a thermally conductive sheet when the carbon fiber length is 150 μm.
Figure 11:
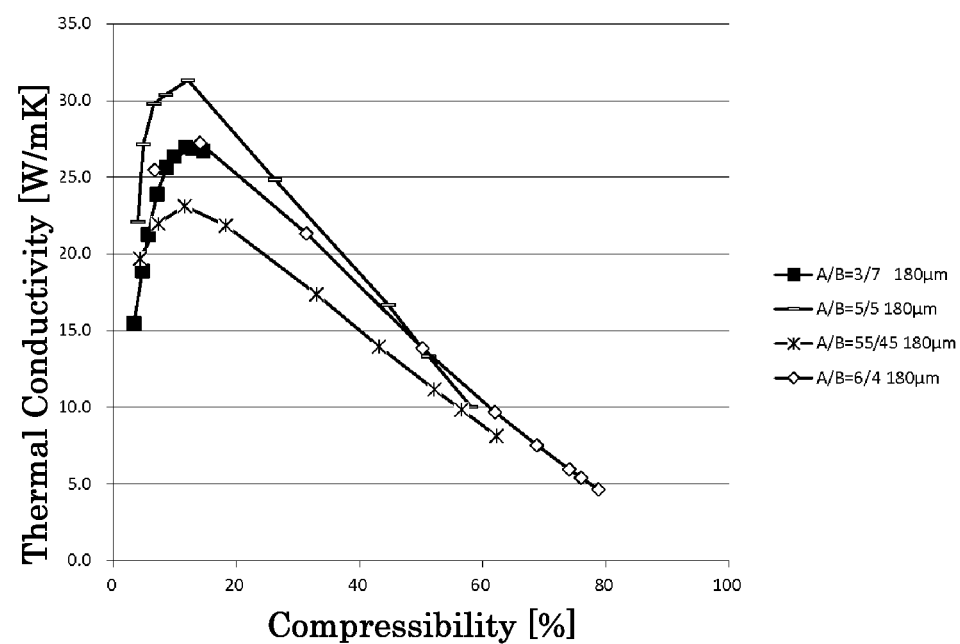
FIG. 11 is a graph showing the thermal conductivity vs. the compressibility of a thermally conductive sheet when the carbon fiber length is 180 μm.
Figure 12:
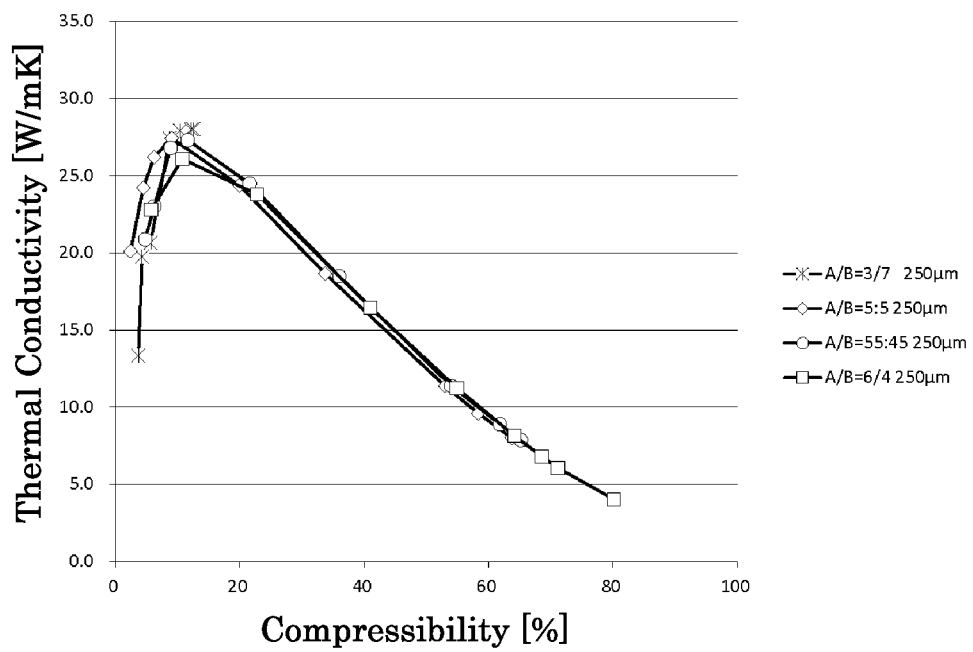
FIG. 12 is a graph showing the thermal conductivity vs. the compressibility of a thermally conductive sheet when the carbon fiber length is 250 μm.
Figure 13:
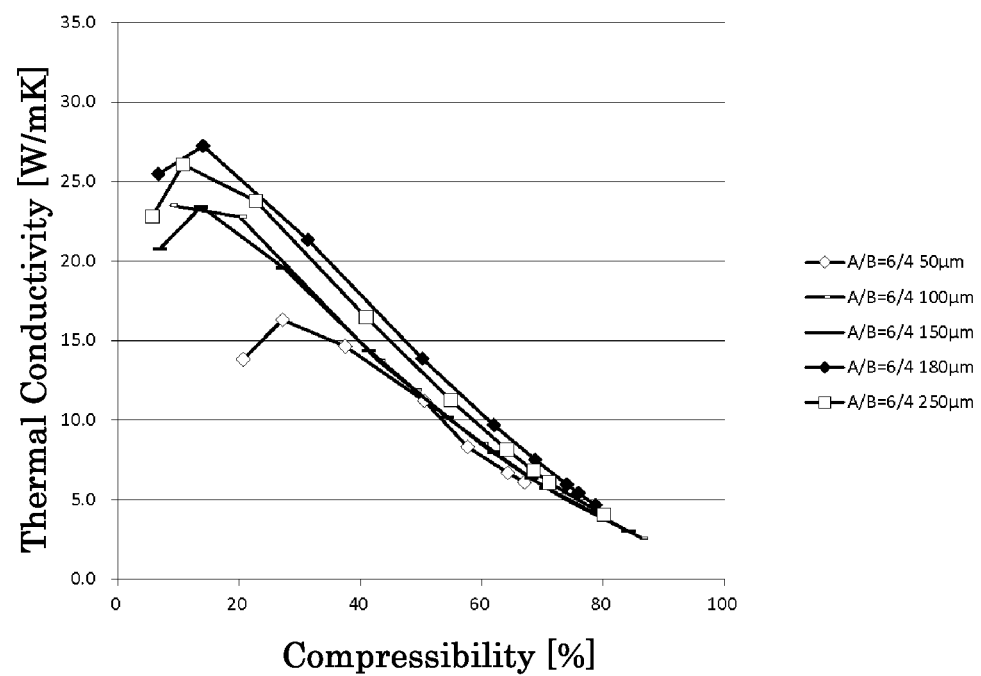
FIG. 13 is a graph showing the thermal conductivity vs. the compressibility of a thermally conductive sheet when the blend ratio (silicone base resin A:curing agent B) of a silicone base resin A to a curing agent B is 6:4.
Figure 14:
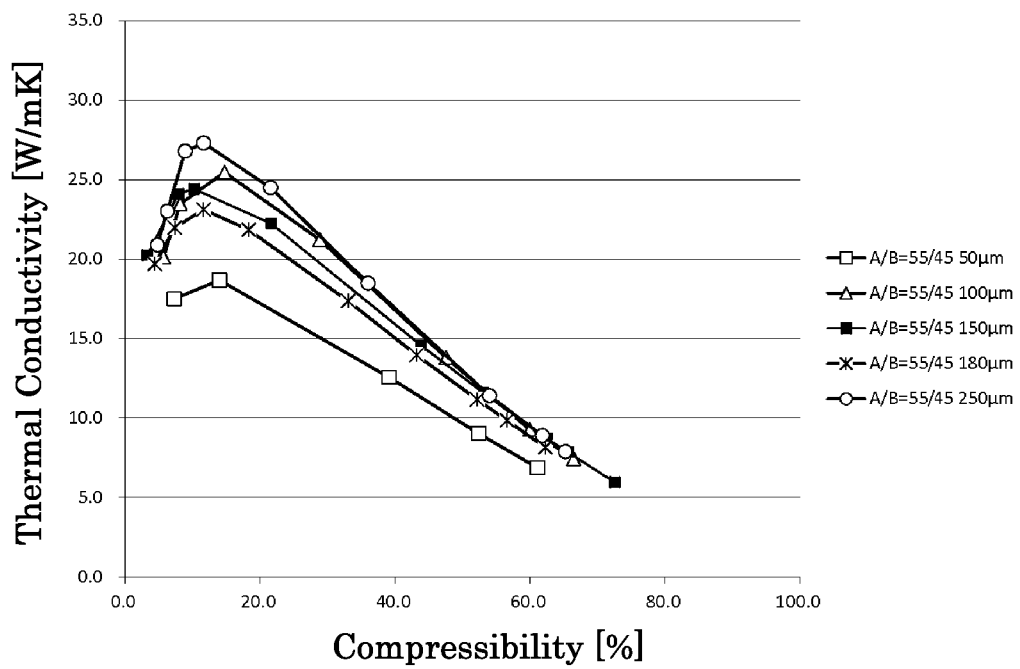
FIG. 14 is a graph showing the thermal conductivity vs. the compressibility of a thermally conductive sheet when the blend ratio (silicone base resin A:curing agent B) of the silicone base resin A to the curing agent B is 55:45.
Figure 15:
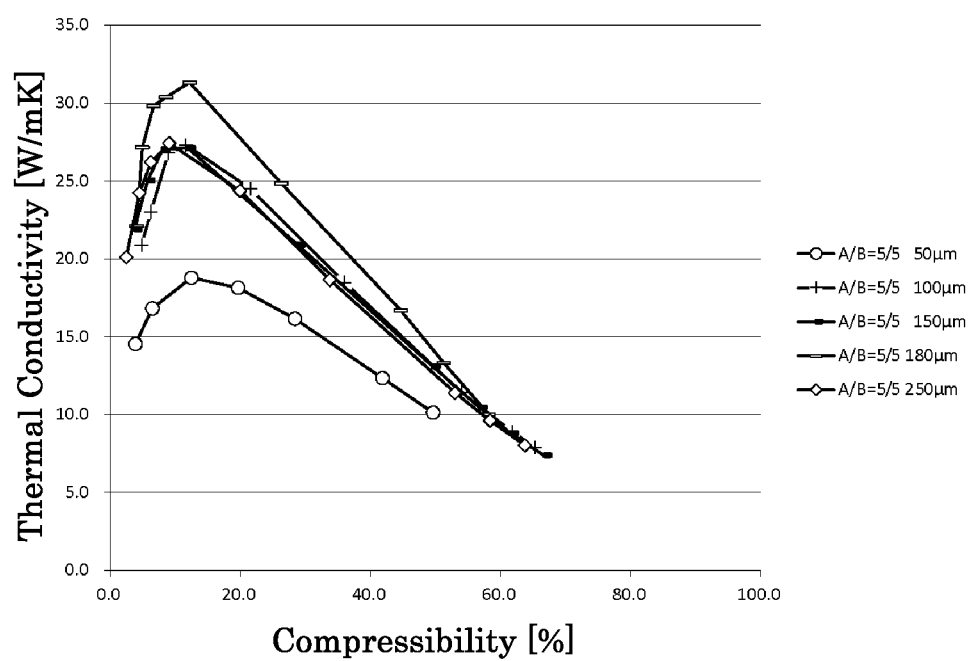
FIG. 15 is a graph showing the thermal conductivity vs. the compressibility of a thermally conductive sheet when the blend ratio (silicone base resin A:curing agent B) of the silicone base resin A to the curing agent B is 5:5.
Figure 16:
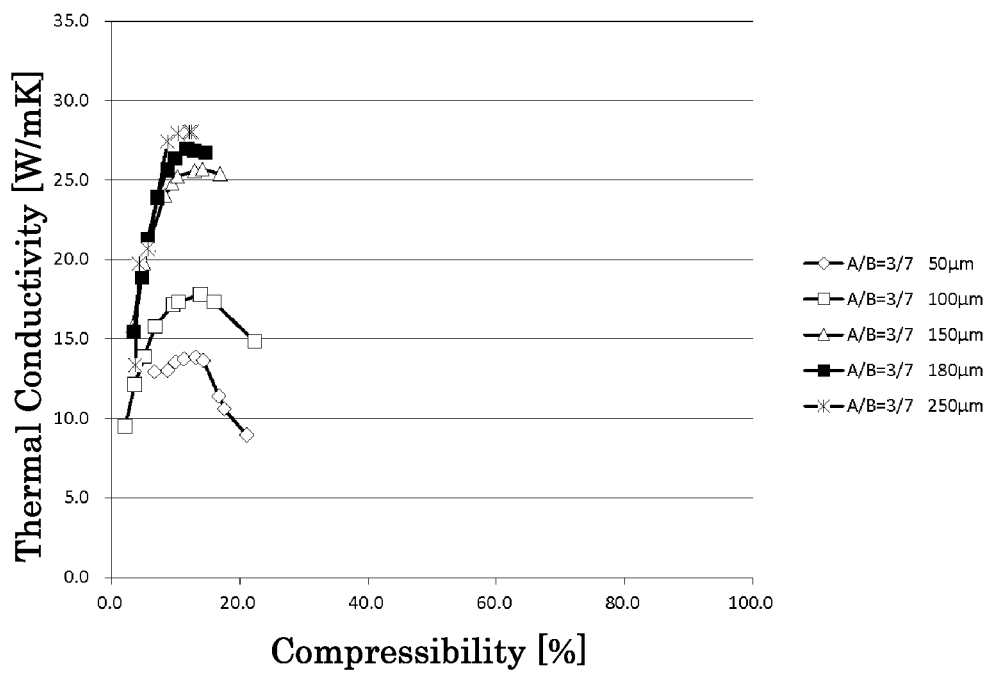
FIG. 16 is a graph showing the thermal conductivity vs. the compressibility of a thermally conductive sheet when the blend ratio (silicone base resin A:curing agent B) of the silicone base resin A to the curing agent B is 3:7.

In the full molding step S23, for example, as shown in FIG. 5D, the laminated body 14A obtained in the alignment step S22 is cured to thereby mold a fully molded body 16 in which the temporarily molded bodies 14 constituting the laminated body 14A are integrated as shown in FIG. 5E and FIG. 7A and FIG. 7B. Examples of methods for curing the laminated body 14A include a method of heating the laminated body 14A by a heating apparatus, and a method of heating and pressurizing the laminated body 14A by a heating and pressurizing apparatus. Further when an acrylic resin is used as the curable resin composition constituting the thermally conductive composition 12, the laminated body 14A can be cured at normal temperature, for example, by incorporating an isocyanate compound in the thermally conductive composition 12.

As these methods for curing the laminated body 14A, preferable is the method of heating and pressurizing the laminated body 14A by a heating and pressurizing apparatus, that is, the method in which when the laminated body 14A is cured, the laminated body 14A is pressed in the direction orthogonal (perpendicular direction) to the longitudinal direction of the plurality of the temporarily molded bodies 14 constituting the laminated body 14A. By pressing the laminated body 14A in such a manner, since bubbles can be more reliably removed from the laminated body 14A, the fully molded body 16 having better flame retardancy can be obtained in the full molding step S23.

By thus aligning a plurality of columnar temporarily molded bodies in the longitudinal direction, molding a fully molded body in which the plurality of temporarily molded bodies are integrated, and cutting the fully molded body in the direction substantially orthogonal to the longitudinal direction thereof, the thermal conductivity in the thickness direction of the thermally conductive sheet 1 can be made better.

4. EXAMPLES

Hereinafter, examples of the present invention will be described. In the present Examples, silicone resin compositions containing thermally conductive fibers and thermally conductive particles were prepared, and there was evaluated the thermal conductivity in the thickness direction of a thermally conductive sheet obtained from the silicone resin compositions each with respect to the compressibility of the thermally conductive sheet. There was further evaluated the thermal resistance of the thermally conductive sheet when the thermally conductive sheet was maintained in a compressed state. In the present Examples, the average fiber length of the thermally conductive fibers was a calculated value obtained by measuring each thermally conductive fiber by a microscope (manufactured by HiROX Co. Ltd., KH7700), and the average particle diameter of the thermally conductive particles was a value measured by a particle size distribution meter. Here, the present invention is not limited to these Examples.

The thermal conductivity in the thickness direction of the thermally conductive sheet vs. the compressibility thereof Example 1

In Example 1, as shown in Table 1, 20.4% by volume of alumina particles having been coupling-treated with a silane coupling agent and having an average particle diameter of 5 µm and 24% by volume of aluminum nitride particles having an average particle diameter of 1 µm, as the thermally conductive particles, and 22.3% by volume of pitch-based carbon fibers having an average fiber length of 50 µm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and a silicone base resin A and a curing agent B were blended so that the blend ratio (silicone base resin A:curing agent B) was 6:4.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby form a silicone cured product. The silicone cured product was cut into a thickness of 2.0 mm by an ultrasonic cutter to thereby obtain a thermally conductive sheet.

Example 2

In Example 2, a thermally conductive sheet was obtained as in Example 1, except for using a two-part addition reaction type liquid silicone resin in which the silicone base resin A and the curing agent B were blended so that the blend ratio (silicone base resin A:curing agent B) was 55:45, as shown in Table 1.

Example 3

In Example 3, a thermally conductive sheet was obtained as in Example 1, except for using a two-part addition reaction type liquid silicone resin in which the silicone base resin A and the curing agent B were blended so that the blend ratio (silicone base resin A:curing agent B) was 5:5, as shown in Table 1.

Comparative Example 1

In Comparative Example 1, a thermally conductive sheet was obtained as in Example 1, except for using a two-part addition reaction type liquid silicone resin in which the silicone base resin A and the curing agent B were blended so that the blend ratio (silicone base resin A:curing agent B) was 3:7, as shown in Table 1.

Example 4

In Example 4, a thermally conductive sheet was obtained as in Example 1, except for using pitch-based carbon fibers having an average fiber length of 100 µm as the thermally conductive fibers, as shown in Table 1.

Example 5

In Example 5, a thermally conductive sheet was obtained as in Example 4, except for using a two-part addition reaction type liquid silicone resin in which the silicone base resin A and the curing agent B were blended so that the blend ratio (silicone base resin A:curing agent B) was 55:45, as shown in Table 1.

Example 6

In Example 6, a thermally conductive sheet was obtained as in Example 4, except for using a two-part addition reaction type liquid silicone resin in which the silicone base resin A and the curing agent B were blended so that the blend ratio (silicone base resin A:curing agent B) was 5:5, as shown in Table 1.

Comparative Example 2

In Comparative Example 2, a thermally conductive sheet was obtained as in Example 4, except for using a two-part addition reaction type liquid silicone resin in which the silicone base resin A and the curing agent B were blended so that the blend ratio (silicone base resin A:curing agent B) was 3:7, as shown in Table 1.

Example 7

In Example 7, a thermally conductive sheet was obtained as in Example 1, except for using pitch-based carbon fibers having an average fiber length of 150 µm as the thermally conductive fibers, as shown in Table 1.

Example 8

In Example 8, a thermally conductive sheet was obtained as in Example 7, except for using a two-part addition reaction type liquid silicone resin in which the silicone base resin A and the curing agent B were blended so that the blend ratio (silicone base resin A:curing agent B) was 55:45, as shown in Table 1.

Example 9

In Example 9, a thermally conductive sheet was obtained as in Example 7, except for using a two-part addition reaction type liquid silicone resin in which the silicone base resin A and the curing agent B were blended so that the blend ratio (silicone base resin A:curing agent B) was 5:5, as shown in Table 1.

Comparative Example 3

In Comparative Example 3, a thermally conductive sheet was obtained as in Example 7, except for using a two-part addition reaction type liquid silicone resin in which the silicone base resin A and the curing agent B were blended so that the blend ratio (silicone base resin A:curing agent B) was 3:7, as shown in Table 1.

Example 10

In Example 10, a thermally conductive sheet was obtained as in Example 1, except for using pitch-based carbon fibers having an average fiber length of 180 µm as the thermally conductive fibers, as shown in Table 1.

Example 11

In Example 11, a thermally conductive sheet was obtained as in Example 10, except for using a two-part addition reaction type liquid silicone resin in which the silicone base resin A and the curing agent B were blended so that the blend ratio (silicone base resin A:curing agent B) was 55:45, as shown in Table 1.

Example 12

In Example 12, a thermally conductive sheet was obtained as in Example 10, except for using a two-part addition reaction type liquid silicone resin in which the silicone base resin A and the curing agent B were blended so that the blend ratio (silicone base resin A:curing agent B) was 5:5, as shown in Table 1.

Comparative Example 4

In Comparative Example 4, a thermally conductive sheet was obtained as in Example 10, except for using a two-part addition reaction type liquid silicone resin in which the silicone base resin A and the curing agent B were blended so that the blend ratio (silicone base resin A:curing agent B) was 3:7, as shown in Table 1.

Example 13

In Example 13, a thermally conductive sheet was obtained as in Example 1, except for using pitch-based carbon fibers having an average fiber length of 250 µm as the thermally conductive fibers, as shown in Table 1.

Example 14

In Example 14, a thermally conductive sheet was obtained as in Example 13, except for using a two-part addition reaction type liquid silicone resin in which the silicone base resin A and the curing agent B were blended so that the blend ratio (silicone base resin A:curing agent B) was 55:45, as shown in Table 1.

Example 15

In Example 15, a thermally conductive sheet was obtained as in Example 13, except for using a two-part addition reaction type liquid silicone resin in which the silicone base resin A and the curing agent B were blended so that the blend ratio (silicone base resin A:curing agent B) was 5:5, as shown in Table 1.

Comparative Example 5

In Comparative Example 5, a thermally conductive sheet was obtained as in Example 13, except for using a two-part addition reaction type liquid silicone resin in which the silicone base resin A and the curing agent B were blended so that the blend ratio (silicone base resin A:curing agent B) was 3:7, as shown in Table 1.

TABLE 1

| | Silicone Base resin A:Curing Agent B | Carbon Fiber Length (µm) | Carbon Fiber vol % | Alumina vol % | Aluminum Nitride vol % |
|---|---|---|---|---|---|
| Example 1 | A/B = 6/4 | 50 | 22.3 | 20.4 | 24 |
| Example 2 | A/B = 55/45 | 50 | | | |
| Example 3 | A/B = 5/5 | 50 | | | |

TABLE 1-continued

| | Silicone Base resin A:Curing Agent B | Carbon Fiber Length (μm) | Carbon Fiber vol % | Alumina vol % | Aluminum Nitride vol % |
|---|---|---|---|---|---|
| Comparative Example 1 | A/B = 3/7 | 50 | | | |
| Example 4 | A/B = 6/4 | 100 | | | |
| Example 5 | A/B = 55/45 | 100 | | | |
| Example 6 | A/B = 5/5 | 100 | | | |
| Comparative Example 2 | A/B = 3/7 | 100 | | | |
| Example 7 | A/B = 6/4 | 150 | | | |
| Example 8 | A/B = 55/45 | 150 | | | |
| Example 9 | A/B = 5/5 | 150 | | | |
| Comparative Example 3 | A/B = 3/7 | 150 | | | |
| Example 10 | A/B = 6/4 | 180 | | | |
| Example 11 | A/B = 55/45 | 180 | | | |
| Example 12 | A/B = 5/5 | 180 | | | |
| Comparative Example 4 | A/B = 3/7 | 180 | | | |
| Example 13 | A/B = 6/4 | 250 | | | |
| Example 14 | A/B = 55/45 | 250 | | | |
| Example 15 | A/B = 5/5 | 250 | | | |
| Comparative Example 5 | A/B = 3/7 | 250 | | | |

Measurement of the Thermal Conductivity

By a measurement method according to ASTM-D5470, the thermal conductivity of the thermally conductive sheets each of Examples 1 to 15 and Comparative Examples 1 to 5 was measured by applying a load (0.5, 1, 1.5, 2, 3, 4, 5, 6, or 7.5 kgf/cm$^2$) on the thermally conductive sheet. Here, a proportion of a change in the thickness of the thermally conductive sheet when a load was applied with 2.0 mm of the initial thickness being taken to be 100% was defined as a compressibility at the load of the thermally conductive sheet.

FIG. 8 to FIG. 12 are graphs each indicating the thermal conductivity vs. the compressibility of the thermally conductive sheet when the corresponding carbon fiber lengths are 50 μm, 100 μm, 150 μm, 180 μm and 250 μm. Further FIG. 13 to FIG. 16 are graphs each indicating the thermal conductivity vs. the compressibility of the thermally conductive sheet when the corresponding blended ratios (silicone base resin A:curing agent B) of the silicone base resin A to the curing agent B were 6:4, 55:45, 5:5 and 3:7. The case where the silicone base resin A and the curing agent B were in equal amounts of 5:5 exhibited fluidity due to uncured components, but the case where the silicone base resin A and the curing agent B were 3:7, since being completely cured, exhibited no fluidity and was worsened in the compression property.

As is clear from FIG. 8 to FIG. 16, it was found that when the thermally conductive sheet had a compressibility of 40% or more, the thermally conductive sheet filled up differences in gap between a heat source and a heat-dissipating member and improved the close adhesiveness to thereby provide the excellent thermal conductivity. It was further found that when the blend ratio (silicone base resin A:curing agent B) of the silicone base resin A to the curing agent B was 5:5 to 6:4, the thermally conductive sheet having a compressibility of 40% or more was obtained. It was further found that when the average fiber length of the thermally conductive fibers was 100 μm or more and 250 μm or less, there was obtained an excellent peak value of the thermal conductivity of 20 W/mK or more at a compressibility of 40% or less.

Thermal resistance of the thermally conductive sheet when the compressed state thereof was maintained.

Example 16

In Example 16, 21% by volume of the alumina particles having been coupling-treated with a silane coupling agent and having an average particle diameter of 5 μm and 22% by volume of the aluminum nitride particles having an average particle diameter of 1 μm, as the thermally conductive particles, and 25% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 55:45.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby make a silicone cured product. The silicone cured product was cut into a thickness of 3.5 mm by an ultrasonic cutter to thereby obtain a thermally conductive sheet. The thermally conductive sheet had a compressibility of 40% or more.

The thermally conductive sheet was interposed between a heat source and a heat-dissipating member; and the initial thermal resistance was measured in the state that the thickness was made constant by applying a load of 0.5 kgf/cm$^2$. The initial thermal resistance was 1.29 K·cm$^2$/W. Thereafter, the thermally conductive sheet was put in a constant-temperature bath at 85° C. in the state of being interposed between the heat source and the heat-dissipating member, and taken out after 1,000 hours; and the thermal resistance was measured. The thermal resistance after 1,000 hours was 1.20 K·cm$^2$/W. Therefore, the change rate of the thermal resistance after 1,000 hours to the initial one was −7%. These results are shown in Table 2.

Example 17

In Example 17, a thermally conductive sheet was obtained as in Example 16, except for cutting the thermally conductive sheet into a thickness of 2.0 mm. The thermally conductive sheet had a compressibility of 40% or more.

The thermally conductive sheet was interposed between a heat source and a heat-dissipating member; and the initial thermal resistance was measured in the state that the thickness was made constant by applying a load of 2.0 kgf/cm$^2$. The initial thermal resistance was 1.04 K·cm$^2$/W. Thereafter, the thermally conductive sheet was put in a constant-temperature bath at 85° C. in the state of being interposed between the heat source and the heat-dissipating member, and taken out after 1,000 hours; and the thermal resistance was measured. The thermal resistance after 1,000 hours was 0.79 K·cm$^2$/W. Therefore, the change rate of the thermal resistance after 1,000 hours to the initial one was −25%. These results are shown in Table 2.

Example 18

In Example 18, 31% by volume of the alumina particles having been coupling-treated with a silane coupling agent and having an average particle diameter of 5 μm and 22% by volume of the aluminum nitride particles having an average particle diameter of 1 μm, as the thermally conductive particles, and 16% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 55:45.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby make a silicone cured product. The silicone cured product was cut into a thickness of 3.0 mm by an ultrasonic cutter to thereby obtain a thermally conductive sheet. The thermally conductive sheet had a compressibility of 40% or more.

The thermally conductive sheet was interposed between a heat source and a heat-dissipating member; and the initial thermal resistance was measured in the state that the thickness was made constant by applying a load of 2.0 kgf/cm$^2$. The initial thermal resistance was 2.23 K·cm$^2$/W. Thereafter, the thermally conductive sheet was put in a constant-temperature bath at 85° C. in the state of being interposed between the heat source and the heat-dissipating member, and taken out after 1,000 hours; and the thermal resistance was measured. The thermal resistance after 1,000 hours was 2.16 K·cm$^2$/W. Therefore, the change rate of the thermal resistance after 1,000 hours to the initial one was −3%. These results are shown in Table 2.

Reference Example 1

In Reference Example 1, the thermally conductive sheet of the same composition as in Example 1 was used. A load of 0.5 kgf/cm$^2$ was applied on the thermally conductive sheet without being interposed between a heat source and a heat-dissipating member, and the initial thermal resistance was measured. The initial thermal resistance was 1.31 K·cm$^2$/W. Thereafter, the thermally conductive sheet was put in a constant-temperature bath at 85° C., and taken out after 1,000 hours; and the thermal resistance was measured. The thermal resistance after 1,000 hours was 1.43 K·cm$^2$/W. Therefore, the change rate of the thermal resistance after 1,000 hours to the initial one was 9.2%. These results are shown in Table 2.

Reference Example 2

In Reference Example 2, the thermally conductive sheet of the same composition as in Example 2 was used. A load of 2.0 kgf/cm$^2$ was applied on the thermally conductive sheet without being interposed between a heat source and a heat-dissipating member, and the initial thermal resistance was measured. The initial thermal resistance was 1.0 K·cm$^2$/W. Thereafter, the thermally conductive sheet was put in a constant-temperature bath at 85° C., and taken out after 1,000 hours; and the thermal resistance was measured. The thermal resistance after 1,000 hours was 1.02 K·cm$^2$/W. Therefore, the change rate of the thermal resistance after 1,000 hours to the initial one was 2%. These results are shown in Table 2.

TABLE 2

|  | Example 16 | Example 17 | Example 18 | Reference Example 1 | Reference Example 2 |
| --- | --- | --- | --- | --- | --- |
| Alumina | 21 vol % | 21 vol % | 31 vol % | 21 vol % | 21 vol % |
| Aluminum Nitride | 22 vol % | 22 vol % | 22 vol % | 22 vol % | 22 vol % |
| Carbon Fiber | 25 vol % | 25 vol % | 16 vol % | 25 vol % | 25 vol % |
| Filling Amount of Fillers | <70 vol % | <70 vol % | <70 vol % | <70 vol % | <70 vol % |
| Initial Thickness [mm] | 3.5 | 2 | 3 | 3.5 | 2 |
| Load at Measurement [kgf/cm$^2$] | 0.5 | 2 | 2 | 0.5 | 2 |
| Initial Thermal Resistance [K · cm$^2$/W] | 1.29 | 1.04 | 2.23 | 1.31 | 1 |
| Thermal Resistance after Test [K · cm$^2$/W] | 1.2 | 0.79 | 2.16 | 1.43 | 1.02 |
| Change Rate of Thermal Resistance [%] | −7 | −25 | −3 | 9.2 | 2 |
| Reliability Test | interposed | interposed | interposed | not interposed | not interposed |

Figure 17:
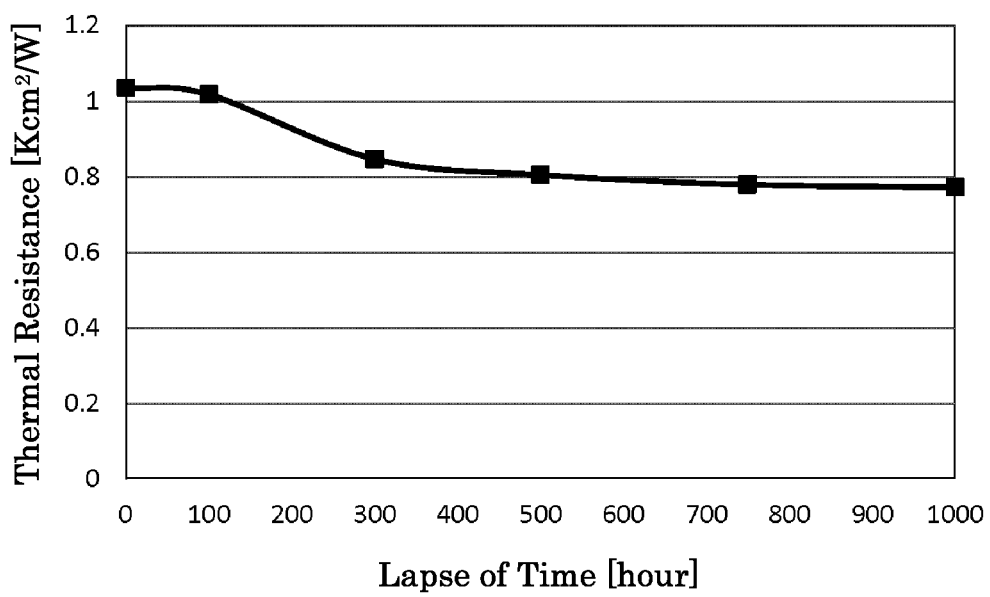
FIG. 17 is a graph showing the thermal resistance vs. the lapse of time in the state of the thermally conductive sheet of Example 17 being interposed between a heat source and a heat-dissipating member.
Figure 18:
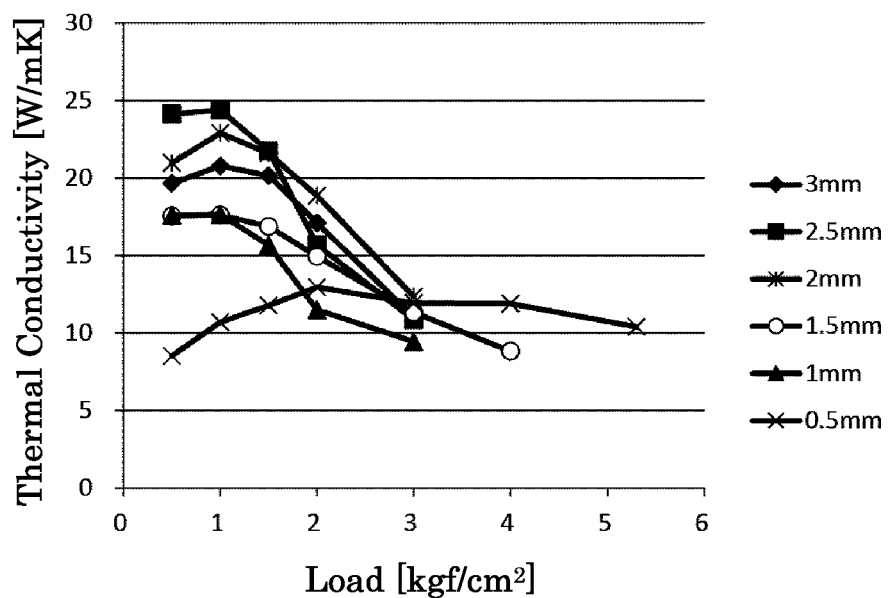
FIG. 18 is a graph showing the thermal conductivity vs. the load of a thermally conductive sheet when the blend ratio (silicone base resin A:curing agent B) of the silicone base resin A to the curing agent B is 55:45.
Figure 19:
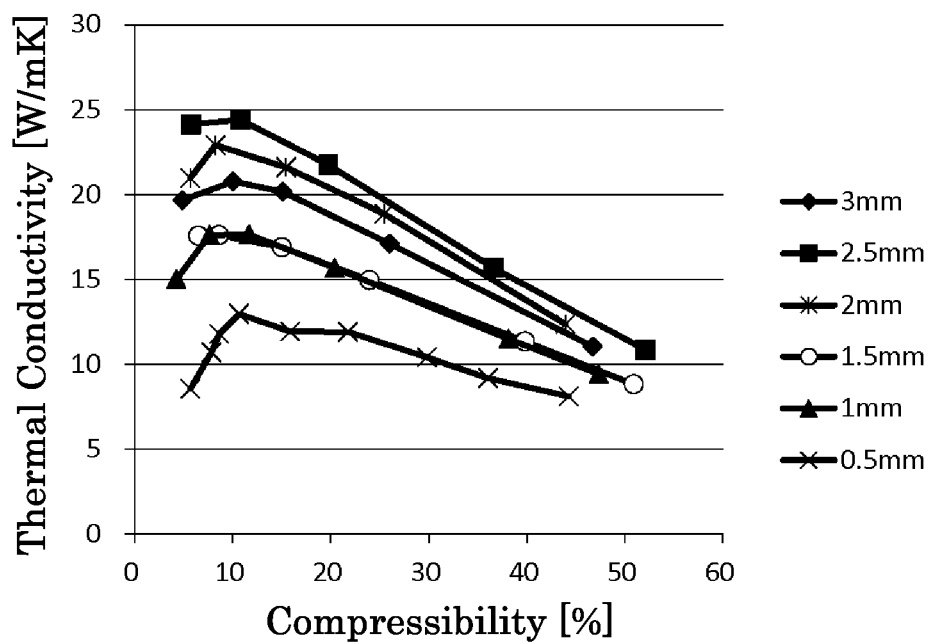
FIG. 19 is a graph showing the thermal conductivity vs. the compressibility of a thermally conductive sheet when the blend ratio (silicone base resin A:curing agent B) of the silicone base resin A to the curing agent B is 55:45.
Figure 20:
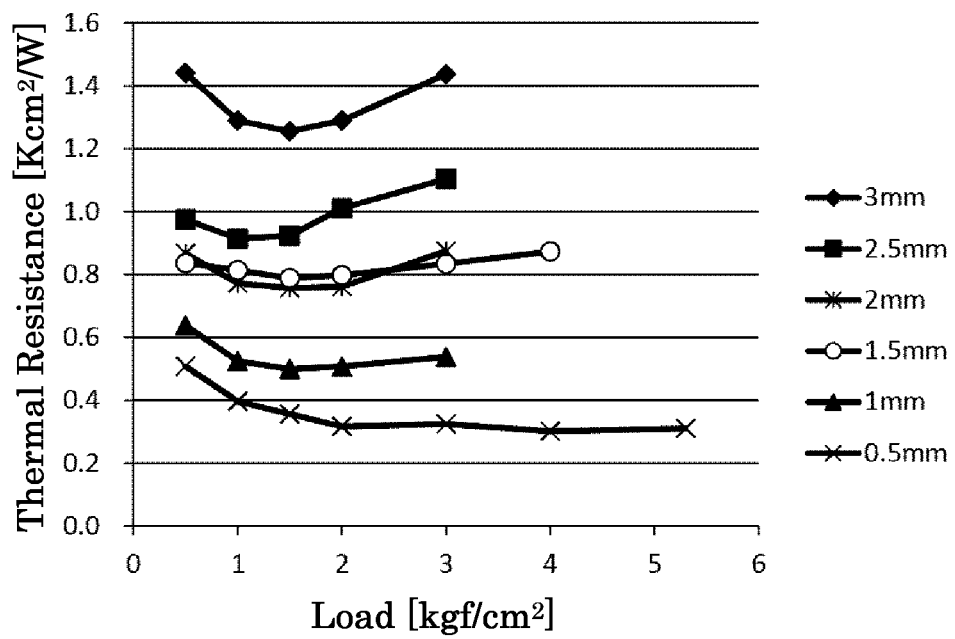
FIG. 20 is a graph showing the thermal resistance vs. the load of a thermally conductive sheet when the blend ratio (silicone base resin A:curing agent B) of the silicone base resin A to the curing agent B is 55:45.
Figure 21:
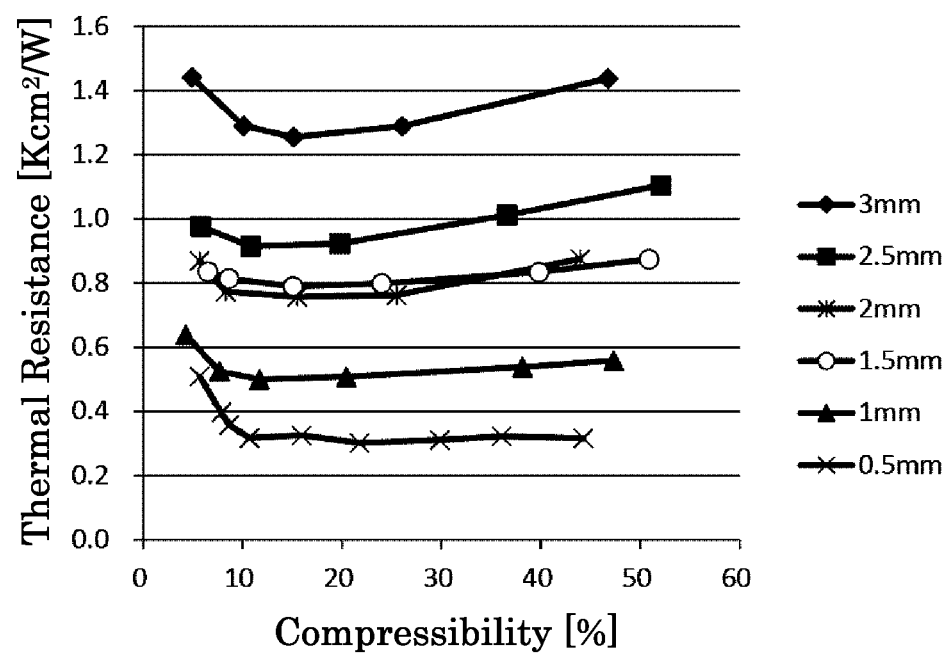
FIG. 21 is a graph showing the thermal resistance vs. the compressibility of a thermally conductive sheet when the blend ratio (silicone base resin A:curing agent B) of the silicone base resin A to the curing agent B is 55:45.
Figure 22:
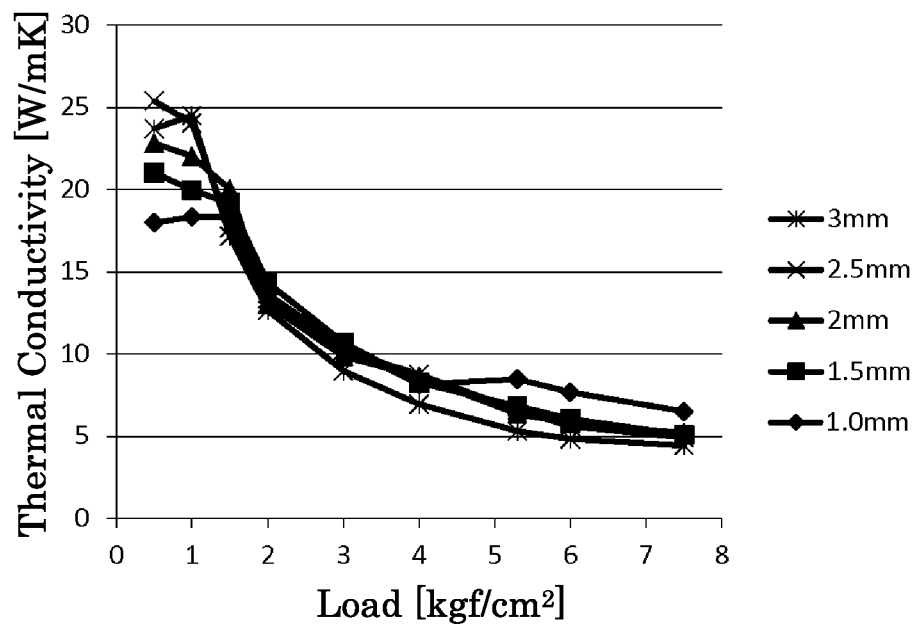
FIG. 22 is a graph showing the thermal conductivity vs. the load of a thermally conductive sheet when the blend ratio (silicone base resin A:curing agent B) of the silicone base resin A to the curing agent B is 60:40.
Figure 23:
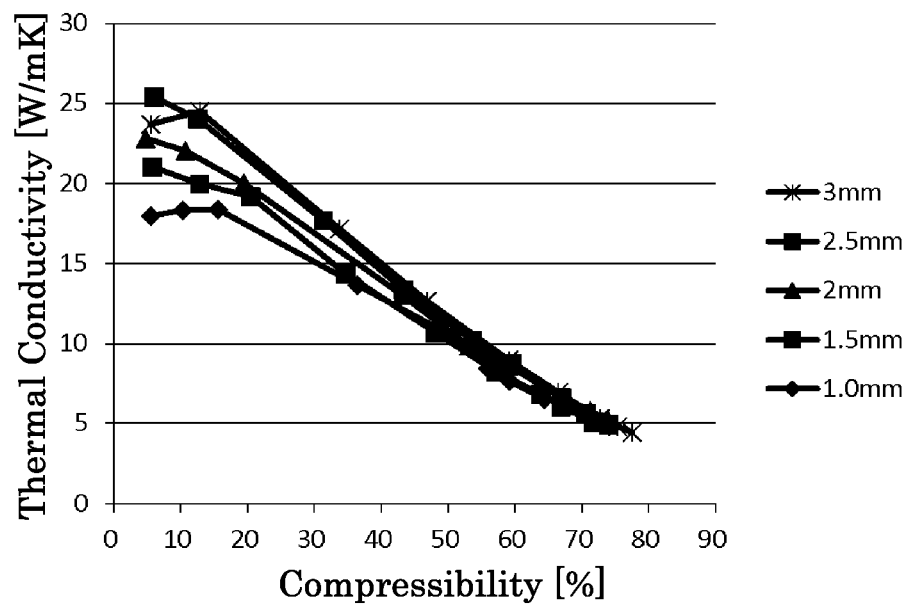
FIG. 23 is a graph showing the thermal conductivity vs. the compressibility of a thermally conductive sheet when the blend ratio (silicone base resin A:curing agent B) of the silicone base resin A to the curing agent B is 60:40.
Figure 24:
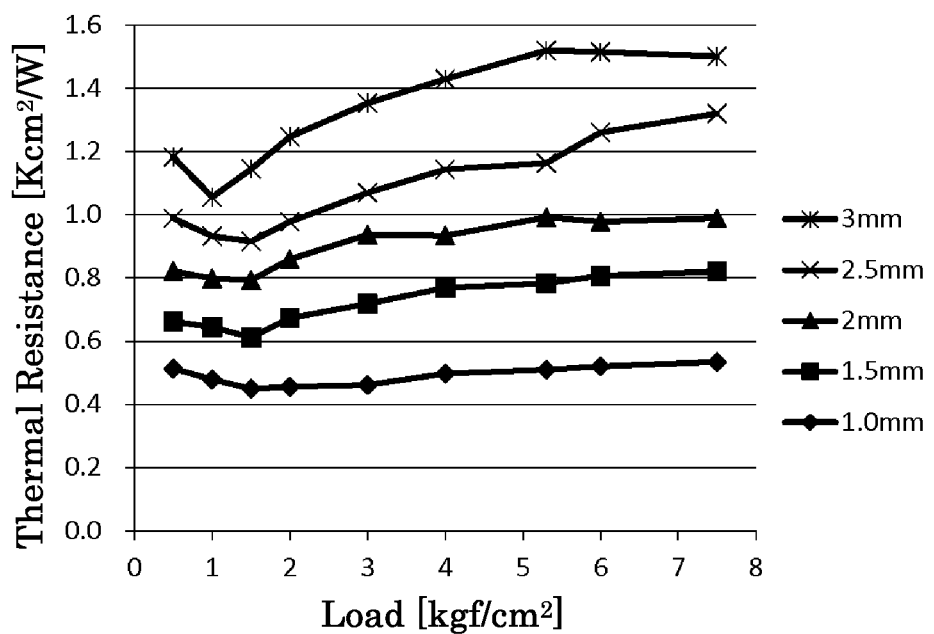
FIG. 24 is a graph showing the thermal resistance vs. the load of a thermally conductive sheet when the blend ratio (silicone base resin A:curing agent B) of the silicone base resin A to the curing agent B is 60:40.
Figure 25:
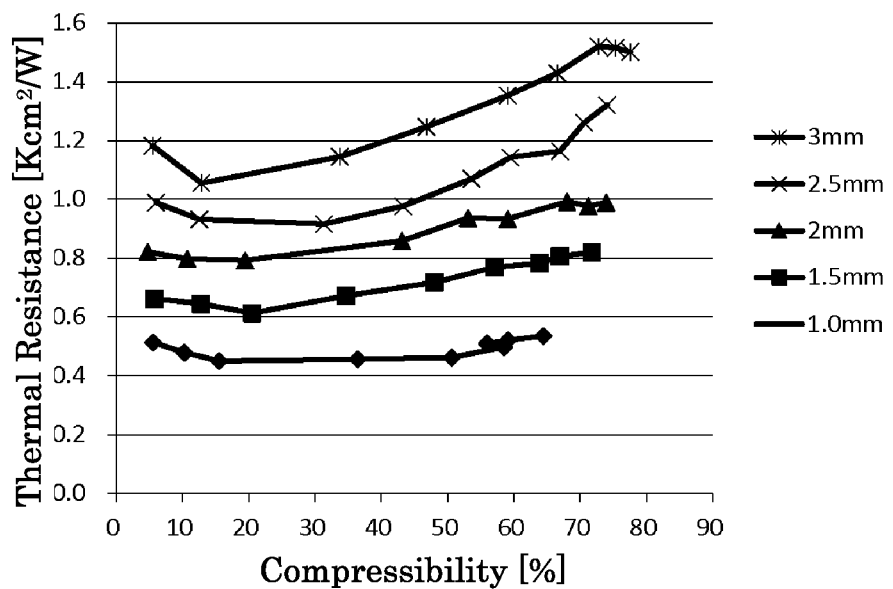
FIG. 25 is a graph showing the thermal resistance vs. the compressibility of a thermally conductive sheet when the blend ratio (silicone base resin A:curing agent B) of the silicone base resin A to the curing agent B is 60:40.

FIG. 17 is a graph indicating the thermal resistance vs. the lapse of time in the state that the thermally conductive sheets of Example 17 were each interposed between a heat source and a heat-dissipating member. The thermally conductive sheets were put in a constant-temperature bath at 85° C. in the state that the thermally conductive sheets were interposed between the heat source and the heat-dissipating member and a load of 2.0 kgf/cm$^2$ was applied, and taken out after 100 hours, 300 hours, 500 hours and 750 hours; and the thermal resistances were measured, respectively. From the graph shown in FIG. 17, it was found that the thermal resistance in the state that a constant displacement or a constant load was maintained was less than that right after the load application, and it was further found that the thermal resistance became substantially constant after the lapse of 800 hours.

As shown in Table 2 and FIG. 17, it was found that when the filling amount of fillers of the thermally conductive particles and the thermally conductive fibers was made to be 70% by volume or less, since the excellent flexibility having a compressibility of 40% or more is provided, the close adhesiveness of the heat source with the heat-dissipating member was improved with the lapse of time and the thermal resistance could be reduced.

About the Influence of the Thickness of the Thermally Conductive Sheet

Then, a thermally conductive sheet having a predetermined thickness was fabricated and the thermal conductivity and the thermal resistance were measured.

Measurement of the Thermal Conductivity

The thermal conductivity was measured by applying a load (kgf/cm$^2$) to the thermally conductive sheet by a measurement method according to ASTM-D5470. Here, a proportion of a change in the thickness of the thermally conductive sheet when a load was applied with the initial thickness being taken to be 100% was defined as a compressibility at the load of the thermally conductive sheet.

Measurement of the Thermal Resistance

The thermal resistance (K·cm$^2$/W) was measured in the state that a sample of 20 mmϕ of the thermally conductive sheet was interposed between a heat source and a heat-dissipating member and a load (kgf/cm$^2$) was applied, by using a thermal resistance measurement apparatus (manufactured by Dexerials Corp.). Here, a proportion of a change in the thickness of the thermally conductive sheet when a load was applied with the initial thickness being taken to be 100% was defined as a compressibility at the load of the thermally conductive sheet.

Example 19

In Example 19, 20.4% by volume of the alumina particles having been coupling-treated with a silane coupling agent and having an average particle diameter of 5 μm and 24.0% by volume of the aluminum nitride particles having an average particle diameter of 1 μm, as the thermally conductive particles, and 22.3% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 55:45.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby form a silicone cured product. The silicone cured product was cut into a thickness of 3.0 mm by an ultrasonic cutter to thereby obtain a thermally conductive sheet. The thermally conductive sheet had a compressibility of 40% or more. FIG. 18 to FIG. 21 and Table 3 indicate the thermal conductivities or the thermal resistances when a load of 0.5 kgf/cm$^2$ (compressibility: 4.893%), 1.0 kgf/cm$^2$ (compressibility: 10.071%), 1.5 kgf/cm$^2$ (compressibility: 20.158%), 2.0 kgf/cm$^2$ (compressibility: 26.036%) and 3.0 kgf/cm$^2$ (compressibility: 46.728%) were applied.

TABLE 3

| Thickness of Thermally Conductive Sheet 3.0 mm | | | | | |
|---|---|---|---|---|---|
| Load [kgf/cm$^2$] | 0.5 | 1.0 | 1.5 | 2.0 | 3.0 |
| Thermal Conductivity [W/mK] | 19.671 | 20.775 | 20.158 | 17.104 | 11.041 |
| Thermal Resistance [K · cm$^2$/W] | 1.441 | 1.290 | 1.255 | 1.289 | 1.437 |
| Compressibility [%] | 4.893 | 10.071 | 15.107 | 26.036 | 46.728 |

Example 20

In Example 20, a thermally conductive sheet was obtained as in Example 19, except for cutting the silicone cured product so that the thickness became 2.5 mm by an ultrasonic cutter. The thermally conductive sheet had a compressibility of 40% or more. FIG. 18 to FIG. 21 and Table 4 indicate the thermal conductivities or the thermal resistances when a load of 0.5 kgf/cm$^2$ (compressibility: 5.771%), 1.0 kgf/cm$^2$ (compressibility: 10.795%), 1.5 kgf/cm$^2$ (compressibility: 19.755%), 2.0 kgf/cm$^2$ (compressibility: 36.586%) and 3.0 kgf/cm$^2$ (compressibility: 52.079%) were applied.

TABLE 4

| Thickness of Thermally Conductive Sheet 2.5 mm | | | | | |
|---|---|---|---|---|---|
| Load [kgf/cm$^2$] | 0.5 | 1.0 | 1.5 | 2.0 | 3.0 |
| Thermal Conductivity [W/mK] | 24.143 | 24.409 | 21.748 | 15.679 | 10.848 |
| Thermal Resistance [K · cm$^2$/W] | 0.976 | 0.914 | 0.923 | 1.011 | 1.104 |
| Compressibility [%] | 5.771 | 10.795 | 19.755 | 36.586 | 52.079 |

Example 21

In Example 21, a thermally conductive sheet was obtained as in Example 19, except for cutting the silicone cured product so that the thickness became 2.0 mm by an ultrasonic cutter. The thermally conductive sheet had a compressibility of 40% or more. FIG. 18 to FIG. 21 and Table 5 indicate the thermal conductivities or the thermal resistances when a load of 0.5 kgf/cm$^2$ (compressibility: 5.680%), 1.0 kgf/cm$^2$ (compressibility: 8.295%), 1.5 kgf/cm$^2$ (compressibility: 15.470%), 2.0 kgf/cm$^2$ (compressibility: 25.480%) and 3.0 kgf/cm$^2$ (compressibility: 43.961%) were applied.

TABLE 5

| Thickness of Thermally Conductive Sheet 2.0 mm | | | | | |
|---|---|---|---|---|---|
| Load [kgf/cm$^2$] | 0.5 | 1.0 | 1.5 | 2.0 | 3.0 |
| Thermal Conductivity [W/mK] | 20.976 | 22.905 | 21.605 | 18.863 | 12.357 |
| Thermal Resistance [K · cm$^2$/W] | 0.868 | 0.773 | 0.757 | 0.762 | 0.875 |
| Compressibility [%] | 5.680 | 8.295 | 15.470 | 25.480 | 43.961 |

Example 22

In Example 22, a thermally conductive sheet was obtained as in Example 19, except for cutting the silicone cured product so that the thickness became 1.5 mm by an ultrasonic cutter. The thermally conductive sheet had a compressibility of 40% or more. FIG. 18 to FIG. 21 and Table 6 indicate the thermal conductivities or the thermal resistances when a load of 0.5 kgf/cm$^2$ (compressibility: 6.501%), 1.0 kgf/cm$^2$ (compressibility: 8.603%), 1.5 kgf/cm$^2$ (compressibility: 15.055%), 2.0 kgf/cm$^2$ (compressibility: 23.978%), 3.0 kgf/cm$^2$ (compressibility: 39.808%) and 4.0 kgf/cm$^2$ (compressibility: 50.901%) were applied.

TABLE 6

| | Thickness of Thermally Conductive Sheet 1.5 mm | | | | | |
|---|---|---|---|---|---|---|
| Load [kgf/cm$^2$] | 0.5 | 1.0 | 1.5 | 2.0 | 3.0 | 4.0 |
| Thermal Conductivity [W/mK] | 17.561 | 17.611 | 16.887 | 14.951 | 11.332 | 8.819 |
| Thermal Resistance [K · cm$^2$/W] | 0.836 | 0.814 | 0.789 | 0.798 | 0.834 | 0.874 |
| Compressibility [%] | 6.501 | 8.603 | 15.055 | 23.978 | 39.808 | 50.901 |

Example 23

In Example 23, a thermally conductive sheet was obtained as in Example 19, except for cutting the silicone cured product so that the thickness became 1.0 mm by an ultrasonic cutter. The thermally conductive sheet had a compressibility of 40% or more. FIG. 18 to FIG. 21 and Table 7 indicate the thermal conductivities or the thermal resistances when a load of 0.5 kgf/cm$^2$ (compressibility: 4.269%), 1.0 kgf/cm$^2$ (compressibility: 7.649%), 1.5 kgf/cm$^2$ (compressibility: 11.679%), 2.0 kgf/cm$^2$ (compressibility: 20.420%), 3.0 kgf/cm$^2$ (compressibility: 38.141%) and 4.0 kgf/cm$^2$ (compressibility: 47.330%) were applied.

TABLE 7

| | Thickness of Thermally Conductive Sheet 1.0 mm | | | | | |
|---|---|---|---|---|---|---|
| Load [kgf/cm$^2$] | 0.5 | 1.0 | 1.5 | 2.0 | 3.0 | 4.0 |
| Thermal Conductivity [W/mK] | 15.003 | 17.603 | 17.651 | 15.668 | 11.494 | 9.430 |
| Thermal Resistance [K · cm$^2$/W] | 0.638 | 0.525 | 0.500 | 0.508 | 0.538 | 0.558 |
| Compressibility [%] | 4.269 | 7.649 | 11.679 | 20.420 | 38.141 | 47.330 |

Example 24

In Example 24, a thermally conductive sheet was obtained as in Example 19, except for cutting the silicone cured product so that the thickness became 0.5 mm by an ultrasonic cutter. The thermally conductive sheet had a compressibility of 40% or more. FIG. 18 to FIG. 21 and Table 8 indicate the thermal conductivities or the thermal resistances when a load of 0.5 kgf/cm$^2$ (compressibility: 5.671%), 1.0 kgf/cm$^2$ (compressibility: 7.860%), 1.5 kgf/cm$^2$ (compressibility: 8.648%), 2.0 kgf/cm$^2$ (compressibility: 10.667%), 3.0 kgf/cm$^2$ (compressibility: 15.892%), 4.0 kgf/cm$^2$ (compressibility: 21.753%), 5.3 kgf/cm$^2$ (compressibility: 29.821%), 6.0 kgf/cm$^2$ (compressibility: 36.038%) and 7.5 kgf/cm$^2$ (compressibility: 44.279%) were applied.

TABLE 8

| | Thickness of Thermally Conductive Sheet 0.5 mm | | | | | | | | |
|---|---|---|---|---|---|---|---|---|---|
| Load [kgf/cm$^2$] | 0.5 | 1.0 | 1.5 | 2.0 | 3.0 | 4.0 | 5.3 | 6.0 | 7.5 |
| Thermal Conductivity [W/mK] | 8.531 | 10.701 | 11.782 | 12.961 | 11.931 | 11.902 | 10.407 | 9.174 | 8.107 |
| Thermal Resistance [K · cm$^2$/W] | 0.509 | 0.397 | 0.357 | 0.317 | 0.325 | 0.302 | 0.311 | 0.322 | 0.316 |
| Compressibility [%] | 5.671 | 7.860 | 8.648 | 10.667 | 15.892 | 21.753 | 29.821 | 36.038 | 44.279 |

Example 25

In Example 25, 20.4% by volume of the alumina particles having been coupling-treated with a silane coupling agent and having an average particle diameter of 5 μm and 24.0% by volume of the aluminum nitride particles having an average particle diameter of 1 μm, as the thermally conductive particles, and 22.3% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 60:40.

The obtained silicone resin composition was extruded into a hollow quadrangular prism-shaped mold (35 mm×35 mm)

to thereby mold a 35 mm-square-shaped silicone molded body. The silicone molded body was heated in an oven at 100° C. for 6 hours to thereby form a silicone cured product. The silicone cured product was cut into a thickness of 3.0 mm by an ultrasonic cutter to thereby obtain a thermally conductive sheet. The thermally conductive sheet had a compressibility of 40% or more. FIG. 22 to FIG. 25 and Table 9 indicate the thermal conductivities or the thermal resistances when a load of 0.5 kgf/cm² (compressibility: 5.522%), 1.0 kgf/cm² (compressibility: 12.867%), 1.5 kgf/cm² (compressibility: 33.780%), 2.0 kgf/cm² (compressibility: 46.857%), 3.0 kgf/cm² (compressibility: 59.113%), 4.0 kgf/cm² (compressibility: 66.573%), 5.3 kgf/cm² (compressibility: 72.782%), 6.0 kgf/cm² (compressibility: 75.367%) and 7.5 kgf/cm² (compressibility: 77.601%) were applied.

TABLE 9

| | Thickness of Thermally Conductive Sheet 3.0 mm | | | | | | | | |
|---|---|---|---|---|---|---|---|---|---|
| Load [kgf/cm²] | 0.5 | 1.0 | 1.5 | 2.0 | 3.0 | 4.0 | 5.3 | 6.0 | 7.5 |
| Thermal Conductivity [W/mK] | 23.706 | 24.504 | 17.168 | 12.650 | 8.966 | 6.942 | 5.312 | 4.824 | 4.427 |
| Thermal Resistance [K · cm²/W] | 1.183 | 1.056 | 1.145 | 1.247 | 1.354 | 1.430 | 1.521 | 1.516 | 1.502 |
| Compressibility [%] | 5.522 | 12.867 | 33.780 | 46.857 | 59.113 | 66.573 | 72.782 | 75.367 | 77.601 |

Example 26

In Example 26, a thermally conductive sheet was obtained as in Example 25, except for cutting the silicone cured product so that the thickness became 2.5 mm by an ultrasonic cutter. The thermally conductive sheet had a compressibility of 40% or more. FIG. 22 to FIG. 25 and Table 10 indicate the thermal conductivities or the thermal resistances when a load of 0.5 kgf/cm² (compressibility: 6.042%), 1.0 kgf/cm² (compressibility: 12.571%), 1.5 kgf/cm² (compressibility: 31.371%), 2.0 kgf/cm² (compressibility: 43.307%), 3.0 kgf/cm² (compressibility: 53.652%), 4.0 kgf/cm² (compressibility: 59.514%), 5.3 kgf/cm² (compressibility: 66.962%), 6.0 kgf/cm² (compressibility: 70.629%) and 7.5 kgf/cm² (compressibility: 74.061%) were applied.

Example 27

In Example 27, a thermally conductive sheet was obtained as in Example 25, except for cutting the silicone cured product so that the thickness became 2.0 mm by an ultrasonic cutter. The thermally conductive sheet had a compressibility of 40% or more. FIG. 22 to FIG. 25 and Table 11 indicate the thermal conductivities or the thermal resistances when a load of 0.5 kgf/cm² (compressibility: 4.800%), 1.0 kgf/cm² (compressibility: 10.710%), 1.5 kgf/cm² (compressibility: 19.467%), 2.0 kgf/cm² (compressibility: 43.161%), 3.0 kgf/cm² (compressibility: 53.111%), 4.0 kgf/cm² (compressibility: 59.107%), 5.3 kgf/cm² (compressibility: 68.042%), 6.0 kgf/cm² (compressibility: 71.279%) and 7.5 kgf/cm² (compressibility: 73.934%) were applied.

TABLE 10

| | Thickness of Thermally Conductive Sheet 2.5 mm | | | | | | | | |
|---|---|---|---|---|---|---|---|---|---|
| Load [kgf/cm²] | 0.5 | 1.0 | 1.5 | 2.0 | 3.0 | 4.0 | 5.3 | 6.0 | 7.5 |
| Thermal Conductivity [W/mK] | 25.392 | 24.047 | 17.677 | 13.345 | 10.207 | 8.759 | 6.603 | 5.601 | 4.929 |
| Thermal Resistance [K · cm²/W] | 0.932 | 0.916 | 0.978 | 1.070 | 1.144 | 1.164 | 1.261 | 1.321 | 1.326 |
| Compressibility [%] | 6.042 | 12.571 | 31.371 | 43.307 | 53.652 | 59.514 | 66.962 | 70.629 | 74.061 |

TABLE 11

| | Thickness of Thermally Conductive Sheet 2.0 mm | | | | | | | | |
|---|---|---|---|---|---|---|---|---|---|
| Load [kgf/cm$^2$] | 0.5 | 1.0 | 1.5 | 2.0 | 3.0 | 4.0 | 5.3 | 6.0 | 7.5 |
| Thermal Conductivity [W/mK] | 22.817 | 22.030 | 20.007 | 13.024 | 9.853 | 8.621 | 6.342 | 5.785 | 5.188 |
| Thermal Resistance [K·cm$^2$/W] | 0.822 | 0.798 | 0.793 | 0.859 | 0.937 | 0.934 | 0.992 | 0.978 | 0.989 |
| Compressibility [%] | 4.800 | 10.710 | 19.467 | 43.161 | 53.111 | 59.107 | 68.042 | 71.279 | 73.934 |

Example 28

In Example 28, a thermally conductive sheet was obtained as in Example 25, except for cutting the silicone cured product so that the thickness became 1.5 mm by an ultrasonic cutter. The thermally conductive sheet had a compressibility of 40% or more. FIG. 22 to FIG. 25 and Table 12 indicate the thermal conductivities or the thermal resistances when a load of 0.5 kgf/cm$^2$ (compressibility: 5.777%), 1.0 kgf/cm$^2$ (compressibility: 12.835%), 1.5 kgf/cm$^2$ (compressibility: 20.523%), 2.0 kgf/cm$^2$ (compressibility: 34.738%), 3.0 kgf/cm$^2$ (compressibility: 48.046%), 4.0 kgf/cm$^2$ (compressibility: 57.129%), 5.3 kgf/cm$^2$ (compressibility: 63.879%), 6.0 kgf/cm$^2$ (compressibility: 66.955%) and 7.5 kgf/cm$^2$ (compressibility: 71.815%) were applied.

TABLE 12

| | Thickness of Thermally Conductive Sheet 1.5 mm | | | | | | | | |
|---|---|---|---|---|---|---|---|---|---|
| Load [kgf/cm$^2$] | 0.5 | 1.0 | 1.5 | 2.0 | 3.0 | 4.0 | 5.3 | 6.0 | 7.5 |
| Thermal Conductivity [W/mK] | 21.033 | 19.977 | 19.179 | 14.339 | 10.704 | 8.250 | 6.824 | 6.056 | 5.080 |
| Thermal Resistance [K·cm$^2$/W] | 0.663 | 0.645 | 0.613 | 0.673 | 0.718 | 0.769 | 0.783 | 0.807 | 0.821 |
| Compressibility [%] | 5.777 | 12.835 | 20.523 | 34.738 | 48.046 | 57.129 | 63.879 | 66.955 | 71.815 |

Example 29

In Example 29, a thermally conductive sheet was obtained as in Example 25, except for cutting the silicone cured product so that the thickness became 1.0 mm by an ultrasonic cutter. The thermally conductive sheet had a compressibility of 40% or more. FIG. 22 to FIG. 25 and Table 13 indicate the thermal conductivities or the thermal resistances when a load of 0.5 kgf/cm$^2$ (compressibility: 5.588%), 1.0 kgf/cm$^2$ (compressibility: 10.313%), 1.5 kgf/cm$^2$ (compressibility: 15.619%), 2.0 kgf/cm$^2$ (compressibility: 36.487%), 3.0 kgf/cm$^2$ (compressibility: 50.618%), 4.0 kgf/cm$^2$ (compressibility: 58.540%), 5.3 kgf/cm$^2$ (compressibility: 55.963%), 6.0 kgf/cm$^2$ (compressibility: 59.207%) and 7.5 kgf/cm$^2$ (compressibility: 64.443%) were applied.

TABLE 13

| | Thickness of Thermally Conductive Sheet 1.0 mm | | | | | | | | |
|---|---|---|---|---|---|---|---|---|---|
| Load [kgf/cm²] | 0.5 | 1.0 | 1.5 | 2.0 | 3.0 | 4.0 | 5.3 | 6.0 | 7.5 |
| Thermal Conductivity [W/mK] | 17.978 | 18.341 | 18.376 | 13.635 | 10.467 | 8.151 | 8.467 | 7.670 | 6.507 |
| Thermal Resistance [K · cm²/W] | 0.514 | 0.479 | 0.450 | 0.456 | 0.462 | 0.498 | 0.510 | 0.521 | 0.535 |
| Compressibility [%] | 5.588 | 10.313 | 15.619 | 36.487 | 50.618 | 58.540 | 55.963 | 59.207 | 64.443 |

As shown in FIG. 18 to FIG. 25, it was found that in the thickness of 3.0 mm or less, there could be obtained the thermally conductive sheets having a compressibility of 40% or more and having a minimum value in the thermal resistance in the load range of 0.5 kgf/cm² or more and 3 kgf/cm² or less. When the thermal resistance value of the thermally conductive sheet, as the load is applied in the load range of 0.5 kgf/cm² or more and 3 kgf/cm² or less, becomes low, and takes the minimum value and thereafter becomes high in such a way, for example, in the case where the thermally conductive sheet together with a heat-dissipating member is installed on a heat-generating body such as an electronic part on a substrate, the heat-generating body and the heat-dissipating member can be closely adhered by a low load, and the excellent thermal conductivity can be provided. Further since the thermally conductive sheet can be installed on the substrate by a low load, risks of breakage of the substrate, and the like can be reduced.

About the Maximum Compression Stress and the Residual Stress of the Thermally Conductive Sheet Then, the silicone base resin A and the curing agent B were blended in a predetermined blend ratio (silicone base resin A:curing agent B), and the maximum compression stress and the residual stress of the thermally conductive sheet of a predetermined thickness were measured.

There was measured the maximum compression stress when a test piece of 25 mm×25 mm was compressed by 40% at a rate of 25.4 mm/min by a tension and compression tester (manufactured by A&D Co., Ltd., Tensilon RTG1225). There was further measured the residual stress when the test piece was held for 10 min in the state of being compressed by 40%. Here, the maximum compression stress in the case where the test piece was compressed at a lower rate than 25.4 mm/min became less than that in the case where being compressed at a rate of 25.4 mm/min.

Test piece: 25 mm×25 mm
Compressibility: 40%
Test rate: 25.4 mm/min
Tester load cell: 2.5 kN
Compression plates: a metal Example 30

In Example 30, 20.4% by volume of the alumina particles having been coupling-treated with a silane coupling agent and having an average particle diameter of 5 μm and 24.0% by volume of the aluminum nitride particles having an average particle diameter of 1 μm, as the thermally conductive particles, and 22.3% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 50:50.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby form a silicone cured product. The silicone cured product was cut into a thickness of 1.0 mm by an ultrasonic cutter to thereby obtain a thermally conductive sheet. The thermally conductive sheet had a compressibility of 40% or more. Further as shown in Table 14, the maximum compression stress was 1,000 N, and the residual stress after 10 min was 220 N.

Example 31

In Example 31, a thermally conductive sheet was obtained as in Example 30, except for cutting the silicone cured product so that the thickness became 1.5 mm by an ultrasonic cutter. The thermally conductive sheet had a compressibility of 40% or more. Further as shown in Table 14, the maximum compression stress was 780 N, and the residual stress after 10 min was 204 N.

Example 32

In Example 32, a thermally conductive sheet was obtained as in Example 30, except for cutting the silicone cured product so that the thickness became 2.0 mm by an ultrasonic cutter. The thermally conductive sheet had a compressibility of 40% or more. Further as shown in Table 14, the maximum compression stress was 700 N, and the residual stress after 10 min was 197 N.

Example 33

In Example 33, a thermally conductive sheet was obtained as in Example 30, except for cutting the silicone cured product so that the thickness became 3.0 mm by an ultrasonic cutter. The thermally conductive sheet had a compressibility of 40% or more. Further as shown in Table 14, the maximum compression stress was 660 N, and the residual stress after 10 min was 178 N.

Example 34

In Example 34, 20.4% by volume of the alumina particles having been coupling-treated with a silane coupling agent and having an average particle diameter of 5 μm and 24.0% by volume of the aluminum nitride particles having an average particle diameter of 1 μm, as the thermally conductive particles, and 22.3% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 55:45.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby form a silicone cured product. The silicone cured product was cut into a thickness of 1.0 mm by an ultrasonic cutter to thereby obtain a thermally conductive sheet. The thermally conductive sheet had a compressibility of 40% or more. Further as shown in Table 14, the maximum compression stress was 980 N, and the residual stress after 10 min was 198 N.

Example 35

In Example 35, a thermally conductive sheet was obtained as in Example 34, except for cutting the silicone cured product so that the thickness became 1.5 mm by an ultrasonic cutter. The thermally conductive sheet had a compressibility of 40% or more. Further as shown in Table 14, the maximum compression stress was 756 N, and the residual stress after 10 min was 188 N.

Example 36

In Example 36, a thermally conductive sheet was obtained as in Example 34, except for cutting the silicone cured product so that the thickness became 2.0 mm by an ultrasonic cutter. The thermally conductive sheet had a compressibility of 40% or more. Further as shown in Table 14, the maximum compression stress was 680 N, and the residual stress after 10 min was 133 N.

Example 37

In Example 37, a thermally conductive sheet was obtained as in Example 34, except for cutting the silicone cured product so that the thickness became 3.0 mm by an ultrasonic cutter. The thermally conductive sheet had a compressibility of 40% or more. Further as shown in Table 14, the maximum compression stress was 610 N, and the residual stress after 10 min was 124 N.

Example 38

In Example 38, 20.4% by volume of the alumina particles having been coupling-treated with a silane coupling agent and having an average particle diameter of 5 μm and 24.0% by volume of the aluminum nitride particles having an average particle diameter of 1 as the thermally conductive particles, and 22.3% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 57:43.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby form a silicone cured product. The silicone cured product was cut into a thickness of 1.0 mm by an ultrasonic cutter to thereby obtain a thermally conductive sheet. The thermally conductive sheet had a compressibility of 40% or more. Further as shown in Table 14, the maximum compression stress was 932 N, and the residual stress after 10 min was 172 N.

Example 39

In Example 39, a thermally conductive sheet was obtained as in Example 38, except for cutting the silicone cured product so that the thickness became 1.5 mm by an ultrasonic cutter. The thermally conductive sheet had a compressibility of 40% or more. Further as shown in Table 14, the maximum compression stress was 712 N, and the residual stress after 10 min was 156 N.

Example 40

In Example 40, a thermally conductive sheet was obtained as in Example 38, except for cutting the silicone cured product so that the thickness became 2.0 mm by an ultrasonic cutter. The thermally conductive sheet had a compressibility of 40% or more. Further as shown in Table 14, the maximum compression stress was 645 N, and the residual stress after 10 min was 120 N.

Example 41

In Example 41, a thermally conductive sheet was obtained as in Example 38, except for cutting the silicone cured product so that the thickness became 3.0 mm by an ultrasonic cutter. The thermally conductive sheet had a compressibility of 40% or more. Further as shown in Table 14, the maximum compression stress was 570 N, and the residual stress after 10 min was 111 N.

Example 42

In Example 42, 20.4% by volume of the alumina particles having been coupling-treated with a silane coupling agent and having an average particle diameter of 5 μm and 24.0% by volume of the aluminum nitride particles having an average particle diameter of 1 μm, as the thermally conductive particles, and 22.3% by volume of the pitch-based carbon fibers having an average fiber length of 150 μm as the thermally conductive fibers were mixed in a two-part addition reaction type liquid silicone resin to thereby prepare a silicone resin composition.

As the two-part addition reaction type liquid silicone resin, one containing an organopolysiloxane as its main component was used; and the silicone base resin A and the curing agent B were blended so that the blend ratio (silicone base resin A:curing agent B) was 60:40.

The obtained silicone resin composition was extruded into a hollow quadrangular prism-shaped mold (35 mm×35 mm) to thereby mold a 35 mm-square-shaped silicone molded body. The silicone molded body was heated in an oven at 100° C. for 6 hours to thereby form a silicone cured product. The silicone cured product was cut into a thickness of 1.0 mm by an ultrasonic cutter to thereby obtain a thermally conductive sheet. The thermally conductive sheet had a compressibility of 40% or more. Further as shown in Table 14, the maximum compression stress was 910 N, and the residual stress after 10 min was 154 N.

Example 43

In Example 43, a thermally conductive sheet was obtained as in Example 42, except for cutting the silicone cured product so that the thickness became 1.5 mm by an ultrasonic cutter. The thermally conductive sheet had a compressibility of 40% or more. Further as shown in Table 14, the maximum compression stress was 690 N, and the residual stress after 10 min was 147 N.

Example 44

In Example 44, a thermally conductive sheet was obtained as in Example 42, except for cutting the silicone cured product so that the thickness became 2.0 mm by an ultrasonic cutter. The thermally conductive sheet had a compressibility of 40% or more. Further as shown in Table 14, the maximum compression stress was 590 N, and the residual stress after 10 min was 90 N.

Example 45

In Example 45, a thermally conductive sheet was obtained as in Example 42, except for cutting the silicone cured product so that the thickness became 3.0 mm by an ultrasonic cutter. The thermally conductive sheet had a compressibility of 40% or more. Further as shown in Table 14, the maximum compression stress was 543 N, and the residual stress after 10 min was 85 N.

TABLE 14

| Thickness of Thermally Conductive Sheet | | Silicone Base resin A:Curing Agent B | | | |
|---|---|---|---|---|---|
| | | 50:50 | 55:45 | 57:43 | 60:40 |
| 1.0 mm | Maximum Compression Stress [N] | 1000 | 980 | 932 | 910 |
| | Residual Stress After 10 min [N] | 220 | 198 | 172 | 154 |
| 1.5 mm | Maximum Compression Stress [N] | 780 | 756 | 712 | 690 |
| | Residual Stress After 10 min [N] | 204 | 188 | 156 | 147 |
| 2.0 mm | Maximum Compression Stress [N] | 700 | 680 | 645 | 590 |
| | Residual Stress After 10 min [N] | 197 | 133 | 120 | 90 |
| 3.0 mm | Maximum Compression Stress [N] | 660 | 610 | 570 | 543 |
| | Residual Stress After 10 min [N] | 178 | 124 | 111 | 85 |

As shown in Table 14, it was found that in the thickness of 3.0 mm or less, the maximum compression stress when the thermally conductive sheet was compressed by 40% at a rate of 25 mm/min or less was 1,000 N or less, and the residual stress when the thermally conductive sheet was compressed by 40% at a rate of 25 mm/min or less, and held for 10 min in the state of being compressed by 40% was 220 N or less. When the maximum compression stress when the thermally conductive sheet is compressed by 40% at a rate of 25 mm/min or less is thus 1,000 N or less, since the load on a substrate during the installation is reduced, risks of breakage of the substrate, and the like can be reduced. Further when the residual stress when the thermally conductive sheet was compressed by 40% at a rate of 25 mm/min or less, and held for 10 min in the state of being compressed by 40% is 220 N or less, the stress exerted on a substrate during the long-term utilization can be reduced.

What is claimed is:

1. A thermally conductive sheet comprising:
   a curable resin composition;
   thermally conductive fibers; and
   thermally conductive particles,
   wherein the thermally conductive sheet has a thickness of more than 1.5 mm and 3.0 mm or less,
   wherein the thermally conductive sheet has a compressibility of 40% or more, and has a minimum value of a thermal resistance in a load range of 0.5 kgf/cm$^2$ or more and 3 kgf/cm$^2$ or less, and
   wherein the thermally conductive sheet has a peak value of a thermal conductivity of 15 W/mK or more in the compressibility thereof of 20% or less.

2. The thermally conductive sheet according to claim 1, wherein
   the thermally conductive sheet has a maximum compression stress of less than 780 N when the thermally conductive sheet is compressed by 40% at a rate of 25 mm/min or less.

3. The thermally conductive sheet according to claim 1, wherein
   the thermally conductive sheet has a residual stress of less than 204 N when the thermally conductive sheet is compressed by 40% at a rate of 25 mm/min or less and is held for 10 min in a state of being compressed by 40%.

4. The thermally conductive sheet according to claim 1, wherein
   the curable resin composition is a two-part addition reaction type liquid silicone resin of a silicone base resin and a curing agent; and the silicone base resin and the curing agent are blended at a ratio (silicone base resin:curing agent) of 5:5 to 6:4.

5. The thermally conductive sheet according to claim 1, wherein
   the thermally conductive fibers have an average fiber length of 50 μm or more and 250 μm or less.

6. The thermally conductive sheet according to claim 1, wherein the thermally conductive sheet has a peak value of a thermal conductivity of 20 W/mK or more in the compressibility thereof of 20% or less.

7. The thermally conductive sheet according to claim 1, wherein
   the thermally conductive sheet has a content of the thermally conductive particles and the thermally conductive fibers of 70% by volume or less.

8. The thermally conductive sheet according to claim 1, wherein
   the thermally conductive sheet is made by cutting a columnar cured product obtained by extruding a thermally conductive composition comprising the curable resin composition, the thermally conductive fibers and the thermally conductive particles, in a substantially perpendicular direction to a longitudinal direction of the columnar cured product.

9. A device comprising:
a heat source;
a heat-dissipating member; and
the thermally conductive sheet according to claim 1 interposed between the heat source and the heat-dissipating member.

10. The device according to claim 9, wherein
the thermally conductive sheet has a thermal resistance of less by 3% or more than an initial value of the thermal resistance of the thermally conductive sheet interposed between the heat source and the heat-dissipating member.

11. A method for producing a thermally conductive sheet, the method comprising:
extruding a thermally conductive composition comprising a curable resin composition, thermally conductive fibers and thermally conductive particles; and
cutting an extruded columnar cured product in a substantially perpendicular direction to a longitudinal direction of the extruded columnar cured product to thereby obtain the thermally conductive sheet,
wherein in the cutting, the extruded columnar cured product is cut to have a predetermined thickness of more than 1.5 mm and 3.0 mm or less so that the thermally conductive sheet exhibits a maximum compression stress of less than 780 N when the thermally conductive sheet is compressed by 40% at a rate of 25 mm/min or less, and the thermally conductive sheet has a peak value of a thermal conductivity of 15 W/mK or more in a compressibility thereof of 20% or less.

12. The method for producing a thermally conductive sheet according to claim 11, wherein
in the cutting, the extruded columnar cured product is cut to have the predetermined thickness so that the thermally conductive sheet exhibits a residual stress of less than 204 N when the thermally conductive sheet is compressed by 40% at a rate of 25 mm/min or less and held for 10 min in a state of being compressed by 40%.

13. The method for producing a thermally conductive sheet according to claim 11, wherein
in the cutting, the extruded columnar cured product is cut to have the predetermined thickness so that the thermally conductive sheet exhibits a thermal resistance of 2.0 K·cm$^2$/W or less in a load range of 0.5 kgf/cm$^2$ or more and 7.5 kgf/cm$^2$ or less.

14. The method for producing a thermally conductive sheet according to claim 11, further comprising pressing the thermally conductive sheet cut in the substantially perpendicular direction, wherein
the pressing is carried out so that the thermally conductive sheet has a thermal resistance of 2.0 K·cm$^2$/W or less in a load range of 0.5 kgf/cm$^2$ or more and 7.5 kgf/cm$^2$ or less.

15. The method for producing a thermally conductive sheet according to claim 14, wherein
the pressing is carried out at a pressure of 0.1 MPa or more and 30 MPa or less.

16. The method for producing a thermally conductive sheet according to claim 14, wherein
the pressing is carried out at a temperature of room temperature or more and 140° C. or less.

17. A thermally conductive sheet which is obtained by the method for producing a thermally conductive sheet according to claim 11.

18. A device comprising:
a heat source;
a heat-dissipating member; and
the thermally conductive sheet according to claim 17 interposed between the heat source and the heat-dissipating member.

19. The device according to claim 18, wherein
the thermally conductive sheet has a thermal resistance of less by 3% or more than an initial value of the thermal resistance of the thermally conductive sheet interposed between the heat source and the heat-dissipating member.

* * * * *